United States Patent [19]

White

[11] Patent Number: 5,576,976

[45] Date of Patent: Nov. 19, 1996

[54] AMPLITUDE DETECTION AND AUTOMATIC GAIN CONTROL OF A SPARSELY SAMPLED SINUSOID BY ADJUSTMENT OF A NOTCH FILTER

[75] Inventor: Stanley A. White, San Clemente, Calif.

[73] Assignee: Rockwell International Corporation, Seal Beach, Calif.

[21] Appl. No.: 116,860

[22] Filed: Sep. 7, 1993

[51] Int. Cl.$^6$ ................................................. H03H 17/00
[52] U.S. Cl. .................. 364/572; 364/724.01; 333/17.1
[58] Field of Search .................... 333/175, 176, 333/178, 181, 17.1, 18; 364/572, 724.01, 724.2, 724.19; 307/521; 328/167; 323/210

[56] References Cited

U.S. PATENT DOCUMENTS

| Re. 32,931 | 5/1989 | Staudte ........................................ 73/505 |
| 3,682,003 | 9/1972 | Sage et al. ................................. 73/503 |
| 3,967,102 | 6/1976 | McCown ............................. 333/17.1 X |
| 3,974,699 | 9/1976 | Morris et al. ............................... 73/432 |
| 4,234,842 | 11/1980 | Brennen et al. .......................... 323/210 |
| 4,431,976 | 2/1984 | Voorman ............................. 333/17.1 X |
| 4,654,663 | 3/1987 | Alsenz et al. ............................. 340/870 |
| 4,789,952 | 12/1988 | Lo et al. ................................. 364/724.2 |
| 4,843,583 | 6/1989 | White et al. ......................... 364/724.19 |
| 4,899,587 | 2/1990 | Staudte ........................................ 73/505 |
| 5,056,366 | 10/1991 | Fersht et al. ............................... 73/505 |
| 5,193,391 | 3/1993 | Cage ........................................ 73/505 |
| 5,331,299 | 7/1994 | Smith ................................... 333/17.1 X |

OTHER PUBLICATIONS

Chi–Tsong Chen, *One–Dimensional Digital Signal Processing*, Marcel Dekker, Inc., New York, NY (1979), pp. 206–215.

Rabiner and Gold, *Theory and Application of Digital Signal Processing*, Prentice–Hall, Inc., Englewood Cliffs, NJ (1975), pp. 136–140, 194–204.

*Primary Examiner*—Emanuel T. Voeltz
*Assistant Examiner*—M. Kemper
*Attorney, Agent, or Firm*—George A. Montanye; Charles T. Silberberg; Tom Streeter

[57] ABSTRACT

An accurate estimate of the amplitude of a sparsely sampled sinusoidal signal is obtained by filtering the squares of the sampled values of the sinusoidal signal with an adjustable notch filter in order to remove a double-frequency component at twice the frequency of the sinusoidal signal. This amplitude estimate, for example, is used for automatic gain control of the amplitude of the sinusoidal signal. Preferably, the notch filter is a digital filter for computing an output signal (v) from successive samples ($x_n$, $x_{n-1}$, $x_{n-2}$) of an input signal (x) according to: $v_n = x_n - \beta x_{n-1} + x_{n-2}$. The frequency control parameter ($\beta$) is computed, so as to automatically track the frequency of the sinusoidal signal, by integrating a product of a derivative ($x_{n-1} - x_{n-2}$) of the input signal (x) and a derivative ($v_n - v_{n-1}$) of the filtered signal (v).

25 Claims, 23 Drawing Sheets

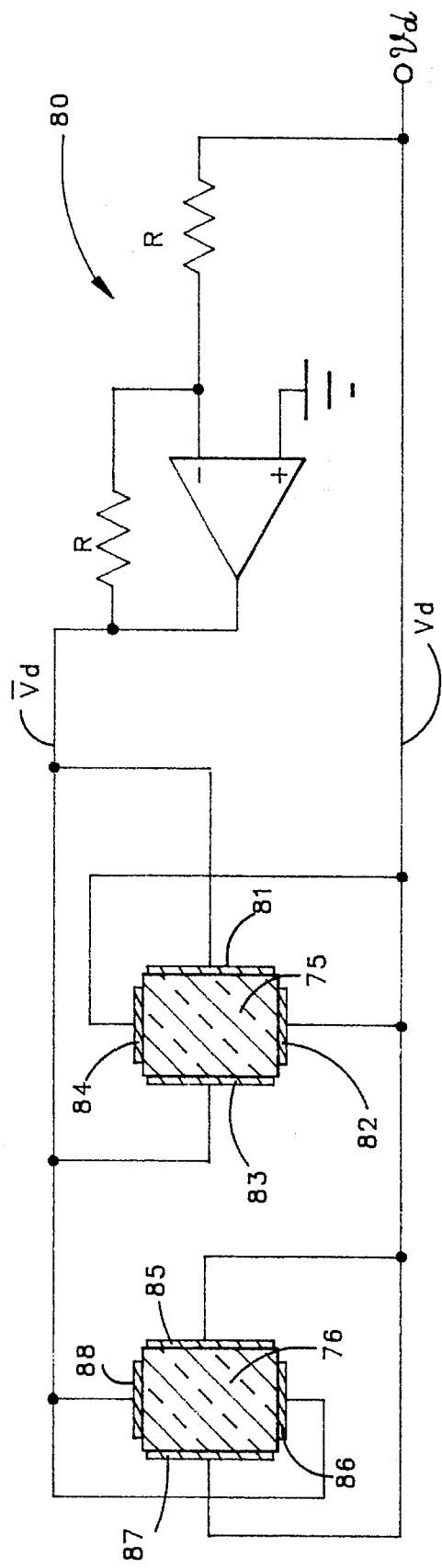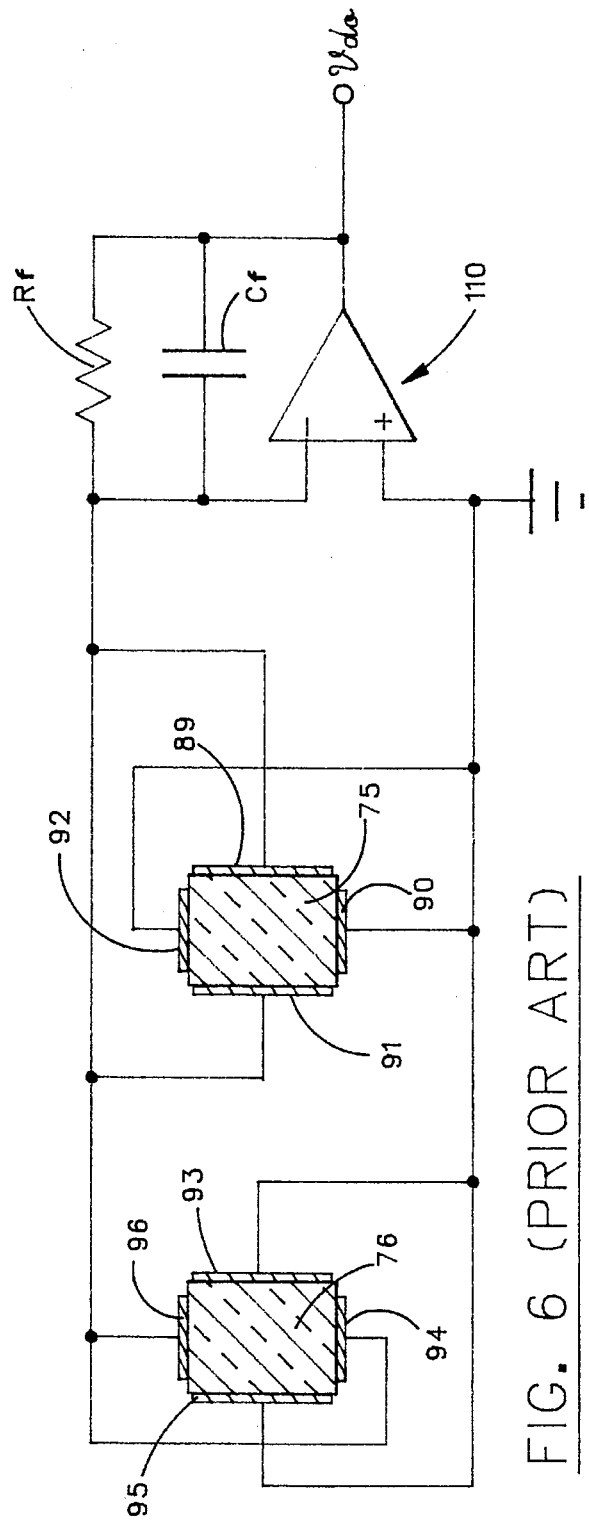
FIG. 5 (PRIOR ART)
FIG. 6 (PRIOR ART)

AMPLITUDE DETECTION AND AUTOMATIC GAIN CONTROL OF A SPARSELY SAMPLED SINUSOID BY ADJUSTMENT OF A NOTCH FILTER

BACKGROUND OF THE INVENTION

1. Field of the Invention

The present invention relates generally to digital signal processing, and more particularly to signal processing for a quartz angular-rate sensor or solid-state gyroscope.

2. Background Art

Angular-rate sensors are essential components of navigational and inertial guidance systems of aircraft, spacecraft, ships, and missiles. Traditionally, mechanical gyroscopes were used for angular rate sensing. More recently, laser ring gyros and vibrating quartz gyros have been developed that have characteristics superior to mechanical gyroscopes.

A particularly economical vibrating quartz gyro is made by acid etching of a quartz wafer and has two pairs of parallel tines in an "H" configuration. Such a quartz gyro is described, for example, in Fersht et al. U.S. Pat. No. 5,056,366 and Staudte U.S. Pat. No. Re 32,931. One pair of tines (the drive tines) is driven by an oscillator so that the tines move toward each other and away from each other. Rotational motion of the tines about the central longitudinal axis of the "H" causes the vibration of the drive tines to couple, by coriolis force, to the other pair of tines (the pick-off tines). The coriolis force causes the pick-up tines to vibrate in such a way that when one pick-off tine moves in one traverse direction perpendicular to the plane of the "H", the other pick-off tine moves in the opposite transverse direction perpendicular to the plane of the "H". The force, which drives the pick-off tines, is proportional to the cross-product of the angular rate of rotation $\Omega$ (e.g., radians per second), and the linear velocity of the drive tines (e.g., meters per second). Metal film pads are plated onto the tines for piezoelectric coupling to these vibrations of the tines. In the electrical pick-off signal, the angular rate of rotation of the quartz gyro about the longitudinal axis appears as double-sideband suppressed-carrier (DSSC) modulation of input angular rate; the carrier frequency is the frequency of oscillation of the drive tines. Therefore, an angular-rate signal can be recovered from the pick-off signal by a synchronous demodulator.

Analog circuits have been used for exciting the quartz gyro and for synchronous demodulation of the pick-off signal. Analog circuits, however, are subject to voltage offsets and drift of component values due to temperature variations and aging. These problems are particularly troublesome due to peculiarities of the quartz gyro that are not apparent from the simplified or "first order" operating characteristics as described above. One problem is related to the resonant frequencies of the drive tines and the pick-off tines. It is undesirable for the pick-off tines to have the same resonant frequency as the drive tines because of the extreme difficulty of removing the dynamics of the pick-off tines from the pick-off signal. If the pick-off tines did have the same resonant frequency as the drive tines, then a maximum amplitude response would be obtained from the pick-off tines, but the angular-rate signal would be a very non-linear function of the angular rate. The resonant frequency of the pick-off tines, however, must be tuned relatively closely to the resonant frequency of the drive tines, or else the dynamic range of the angular-rate signal is limited by noise. Therefore, some resonant frequency offset is required between the drive tines and the pick-off tines. This compromise in resonant frequency offset is to an extent dependent on the bandwidth of the angular-rate signal. In particular, the pick-off tines have a two-pole resonance characteristic, giving a second-order response ($\approx 1/(\omega^2-\omega_o^2)$) far away from the resonant frequency ($\omega_o$). In practice, these considerations dictate that the difference between the resonant frequency of the drive tines and the resonant frequency of the pick-off tines should be about twice the bandwidth of the angular rate to be sensed by the quartz gyro. A typical quartz gyro for inertial navigation applications, for example, has a drive resonant frequency of about 10 kilohertz, a Q of about 18,000, and a difference of about 100 Hz between the drive resonant frequency and the pick-off resonant frequency. The pick-up tines, for example, have the higher resonant frequency. This difference in resonant frequencies causes the amplitude of the angular-rate signal to be dependent on the frequency as well as the amplitude of vibration of the drive tines. Moreover, the temperature dependence of the difference between the drive and pick-off resonant frequencies is the most critical temperature dependent parameter of the quartz gyro.

To obtain sufficient performance for inertial navigation, the analog circuits associated with the quartz gyro have been relatively complex and expensive. Moreover, it is estimated that the limitations of the prior-art analog circuitry causes the performance of the quartz gyro to be about an order of magnitude less than that theoretically possible and attainable by sufficiently complex digital signal processing.

SUMMARY OF THE INVENTION

The present invention is directed to the problem of obtaining an accurate estimate of the amplitude of a sparsely sampled sinusoidal signal. The estimate is used, for example, in an automatic gain control circuit. As will be described below, an accurate estimate is obtained by filtering the squares of the sampled values of the sinusoidal signal in order to remove a double-frequency component at twice the frequency of the sinusoidal signal. The double-frequency component of the sinusoidal signal is substantially eliminated by a self-adjusting notch filter.

Briefly, in accordance with a basic aspect of the present invention, there is provided a method of filtering an input signal (x) to substantially remove a sinusoidal component of the input signal to produce a filtered output signal (v). The method includes the steps of: passing the input signal through an adjustable notch filter controlled by a frequency control signal ($\beta$) setting a signal rejection frequency of the notch filter; producing the frequency control signal ($\beta$) as a predetermined function of the input signal (x) and the filtered output signal (v); and adjusting the notch filter with the frequency control signal ($\beta$) to substantially remove the sinusoidal component from the filtered output signal (v).

In accordance with another aspect of the invention, there is provided a method of detecting amplitude of a sinusoidal signal having a frequency ($\omega$). The method includes the steps of: squaring the signal to produce a product signal including a low-frequency component responsive to the amplitude and a double-frequency component at twice the frequency ($\omega$) of the sinusoidal signal; passing the product signal through an adjustable notch filter to produce a filtered signal including the low-frequency component responsive to the amplitude, the adjustable notch filter having a frequency control input responsive to a frequency control signal ($\beta$) for adjusting a notch frequency at which the adjustable notch filter rejects signals; and adjusting the frequency control signal (β) so that the double-frequency component is substantially rejected by the adjustable notch filter and removed from the filtered signal.

In accordance with yet another aspect, the invention provides a self-adjusting system for filtering an input signal (x) at a signal input to substantially remove a sinusoidal component of the input signal to produce a filtered output signal (v) on a signal output. The system includes: an adjustable notch filter having the signal input, the signal output, and a frequency control input responsive to a frequency control signal (β) for adjusting a notch frequency at which the adjustable notch filter rejects signals; and a frequency control circuit connected to the adjustable notch filter for generating the frequency control signal (β) in response to a product of a derivative of the input signal (x) and a derivative of the output signal (v).

In accordance with a further aspect, the invention provides an amplitude detector circuit for detecting amplitude of a sinusoidal signal having a frequency (ω). The amplitude detector circuit includes: a multiplier for squaring the sinusoidal signal to produce an input signal (x) including a low-frequency component responsive to the amplitude and a double-frequency component at twice the frequency (ω) of the sinusoidal signal; an adjustable notch filter connected to the multiplier for filtering an input signal responsive to the product signal to produce a filtered signal (v) indicating the amplitude, the adjustable notch filter having a frequency control input for receiving a frequency control signal (β) for adjusting a notch frequency at which the adjustable notch filter rejects signals; and a frequency control circuit connected to the adjustable notch filter for producing the frequency control signal (β) and automatically adjusting the frequency control signal in response to the input signal (x) and the filtered signal (v) so that the double-frequency component is substantially rejected by the adjustable notch filter and removed from the filtered signal (v).

In accordance with a final aspect, the invention provides an automatic gain control circuit for adjusting amplitude of a sinusoidal signal having a frequency (ω). The automatic gain control circuit includes: a multiplier for squaring said sinusoidal signal to produce a product signal including a low-frequency component responsive to said amplitude and a double-frequency component at twice the frequency (ω) of said sinusoidal signal; an adjustable notch filter connected to said multiplier for filtering an input signal (x) responsive to said product signal to produce a filtered signal (v) indicating said amplitude, said adjustable notch filter being adjusted to reject said double-frequency component at twice the frequency (ω) of said sinusoidal signal; and a multiplier connected to said adjustable notch filter for adjusting said amplitude of said sinusoidal signal in response to the filtered signal (v).

In a preferred embodiment, the notch filter is a digital filter for computing the output signal (v) from successive samples ($x_n$, $x_{n-1}$, $x_{n-2}$) of the input signal (x) substantially according to: $v_n = x_n - \beta x_{n-1} + x_{n-2}$. The frequency control signal (β) is computed by integrating a product of a derivative ($x_{n-1} - x_{n-2}$) of the input signal (x) and a derivative ($v_n - v_{n-1}$) of the filtered signal (v).

BRIEF DESCRIPTION OF THE DRAWINGS

Other objects and advantages of the present invention will become apparent upon reading the following detailed description and upon reference to the drawings, in which:

FIG. 5 is a cross-section of drive tines of the quartz angular-rate sensor of FIG. 4 along section line 5—5 in FIG. 4;

FIG. 6 is a cross-section of the drive tines of the quartz angular-rate sensor of FIG. 4 along section line 6—6 if FIG. 4;

While the invention will be described in connection with certain preferred embodiments, it is not intended that the invention should be limited to these particular embodiments. On the contrary, the invention is intended to include all modifications, alternatives, and equivalent arrangements as may be included within the scope of the appended claims.

DETAILED DESCRIPTION OF THE PREFERRED EMBODIMENTS

Figure 1:
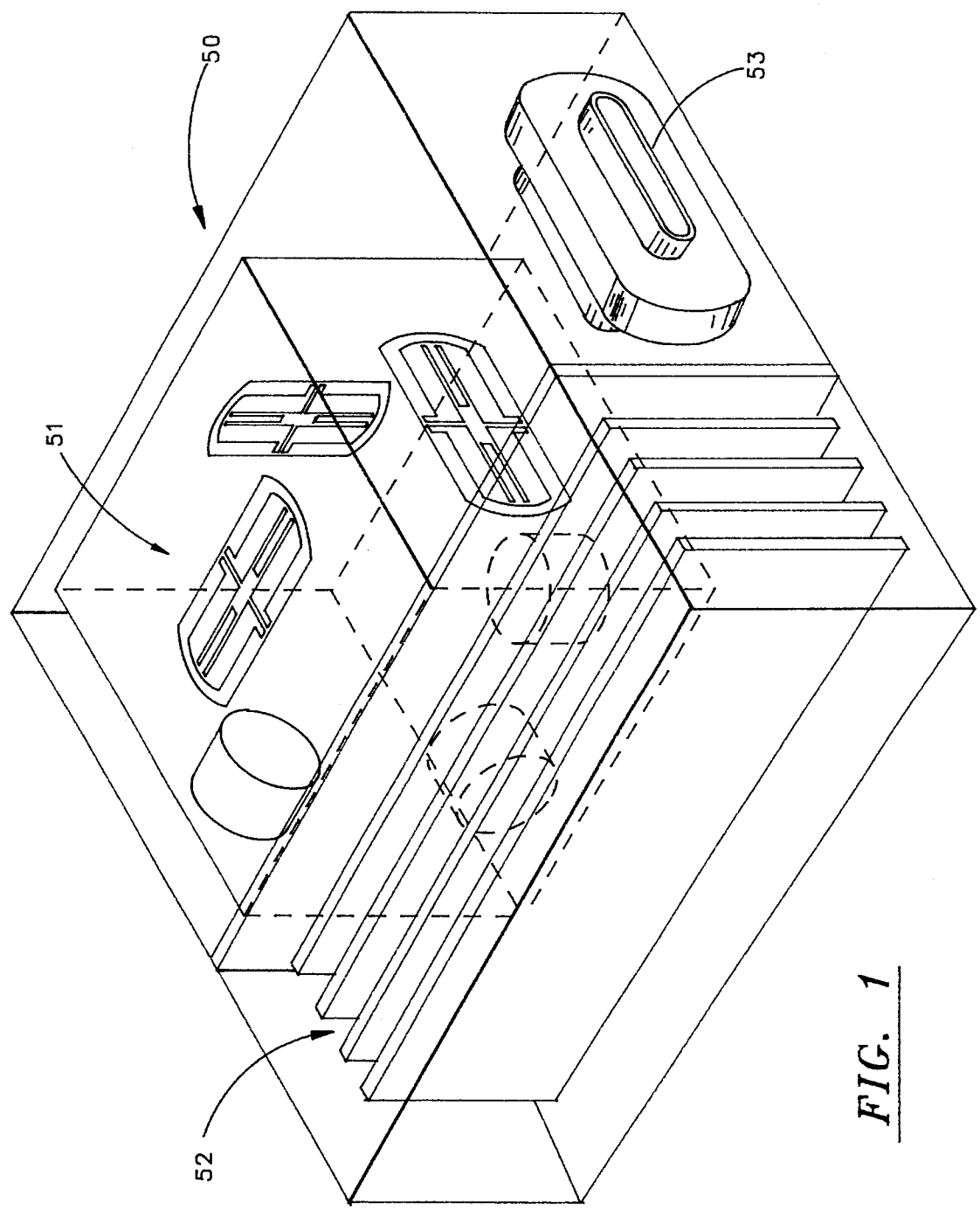
FIG. 1 is a perspective view of an inertial measurement unit incorporating the present invention.

Turning now to the drawings, there is shown in FIG. 1 a schematic perspective view of an inertial measurement unit generally designated 50 incorporating the present invention. The inertial measurement unit includes a block of sensors 51, electronic circuit boards 52, and an electrical connector 53. The inertial measurement unit 50 provides an angular velocity signal and a linear acceleration signal with respect to each of three orthogonal directions. The angular velocity and linear acceleration signals have a 50 Hz bandwidth.

Figure 2:
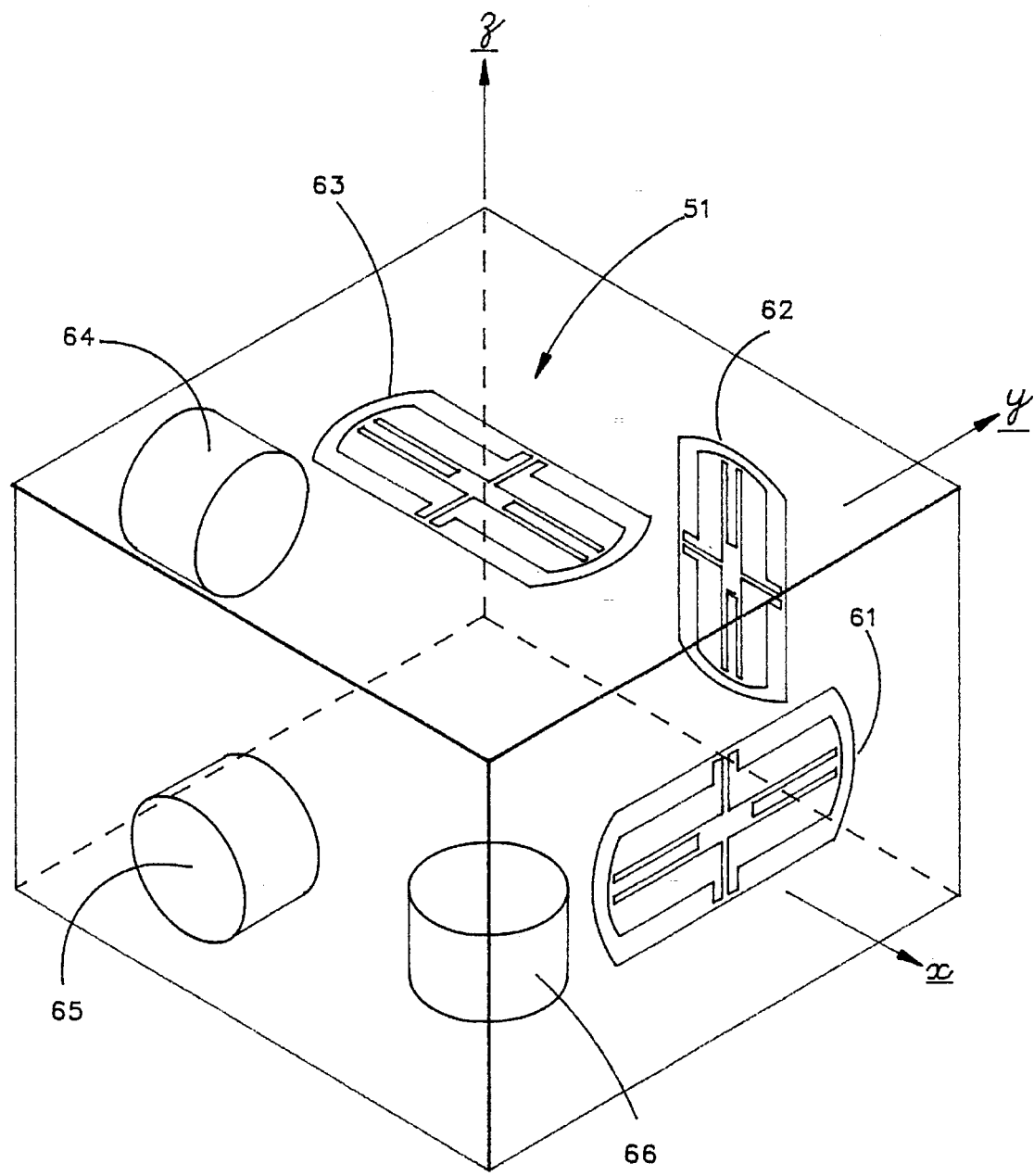
FIG. 2 is a pictorial view of a mounting arrangement for accelerometers and quartz angular-rate sensors used in the inertial measurement unit of FIG. 1.

Turning now to FIG. 2, there is shown a pictorial view of the sensor block 51. The block is made of a rigid material such as aluminum or polycarbonate. A quartz angular-rate sensor or a vibrating quartz accelerometer is mounted into each of the six faces of the block 51. The sensors include quartz angular-rate sensors 61, 62, and 63 mounted on the faces facing the +x, +y, and +z directions. The sensors include vibrating quartz accelerometers 64, 65, and 66 mounted on the faces facing the −x, −y, and −z directions, respectively.

The present invention concerns signal processing for the quartz angular-rate sensors 61, 62, and 63. The quartz angular-rate sensors operate entirely independent of the vibrating quartz accelerometers. Therefore, the vibrating quartz accelerometers 64, 65, 66 are not pertinent to the present invention and will not be described in any further detail.

Figure 3:
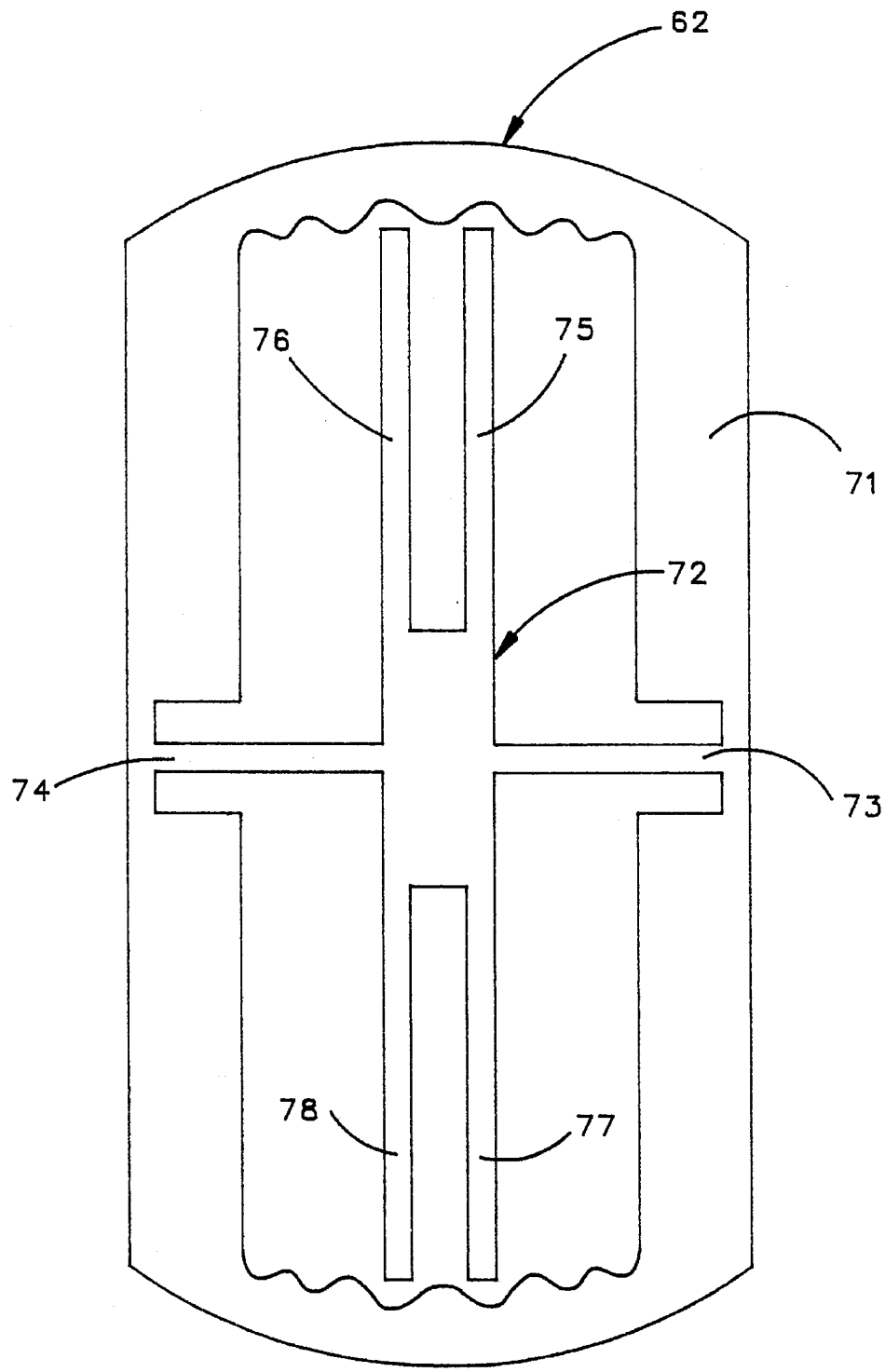
FIG. 3 is a plan view of one of the quartz angular-rate sensors of FIG. 2.

Turning now to FIG. 3, there is shown a more detailed view of the quartz angular-rate sensor 62. The sensor 62 is fabricated from a z-cut quartz wafer using conventional photolithographic and acid etch batch processes, and can be purchased from Systron Donner Corporation of Concord, Calif. The sensor has a frame 71 attached to an "H"-shaped section by a pair of bridges 73, 74. The "H"-shaped section 72 has a pair of drive tines 75, 76, and a pair of pick-up tines 77, 78.

Figure 4:
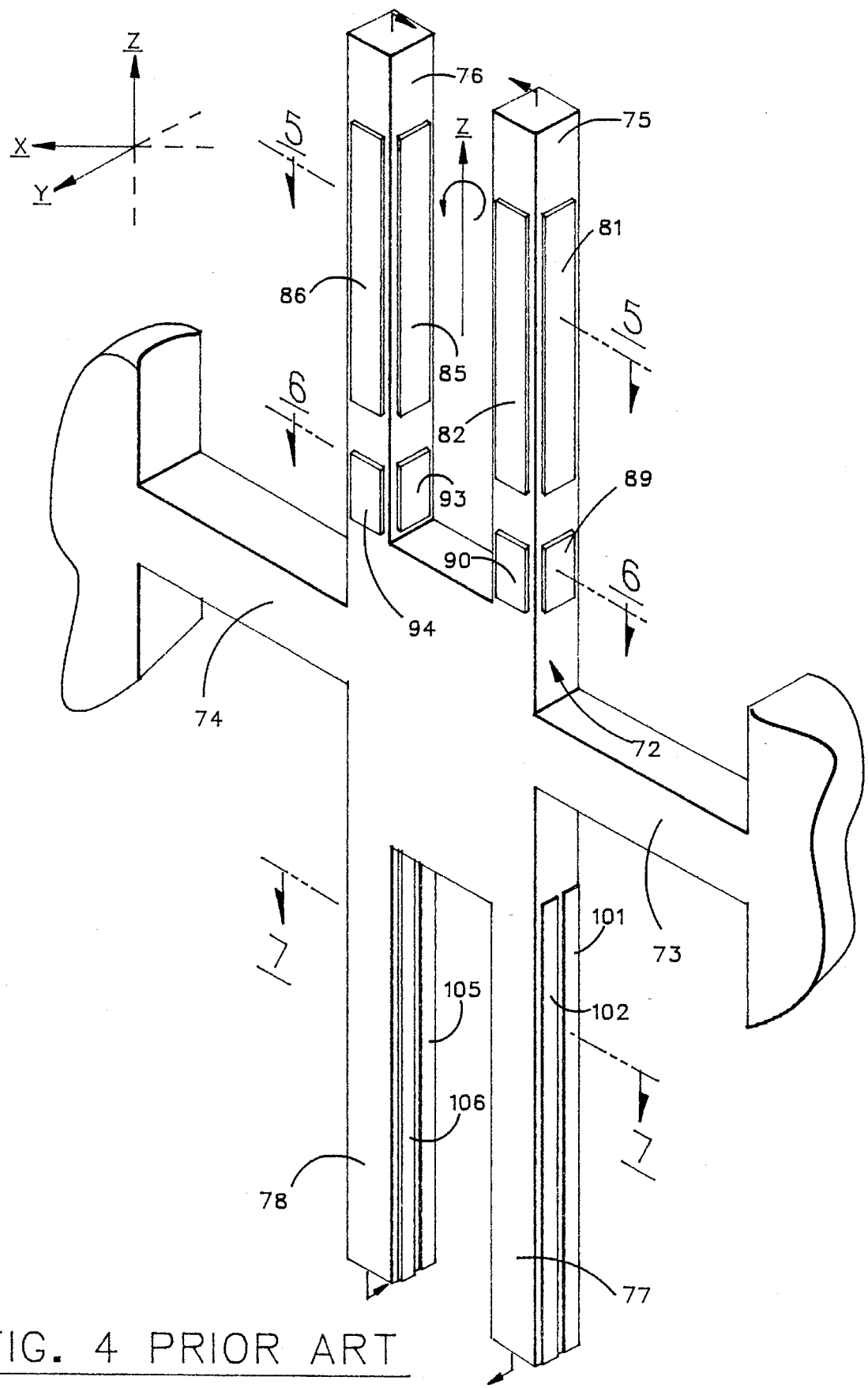
FIG. 4 is a perspective view of a central portion of the quartz angular-rate sensor of FIG. 3.

Turning now to FIG. 4, there is shown a number of metal film electrodes deposited on the tines 75, 76, 77, and 78. The drive tines 75, 76 are provided with drive electrodes 81, 82, 83, 84, 85, 86, 87, 88, as further shown in FIG. 5. The drive electrodes are driven by a complementary drive signal $V_d$, as shown in FIG. 5, to excite a mode of vibration in the drive tines 75, 76 in which the drive tines first move toward each other in the x direction, as shown in FIG. 4, and then away from each other, during each cycle of vibration. To sustain such a mode of vibration, the complementary drive signal $V_d$ must be tuned to the resonant frequency of the drive tines. As shown in FIG. 5, a unity-gain inverting amplifier 80 is used in providing the complementary drive signal from a single-ended drive signal.

To drive the drive tines 75, 76 at their resonant frequency, the drive tines are excited in response to sensing their elastic deformation. For this purpose, a second set of metal film electrodes 89 to 96, as further shown in FIG. 6, are disposed on the drive tines 75, 76 at locations of maximum elastic deformation where the tines are joined to the central portion of the H-shaped structure 72, as shown in FIG. 4. These electrodes 89 to 96 are connected to a conventional amplifier 110 providing a signal $v_{do}$ indicating the elastic deformation of the drive tines 75, 76.

As shown in FIG. 4, the vibration of the pick-up tines 77, 78 is sensed by metal film electrodes 101 to 108 deposited on the pick-up tines. As further shown in FIG. 7, the pick-up electrodes 101 to 108 are connected to a conventional amplifier 111 to provide a signal $v_r$ indicating the vibration of the pick-up tines.

Figure 7:
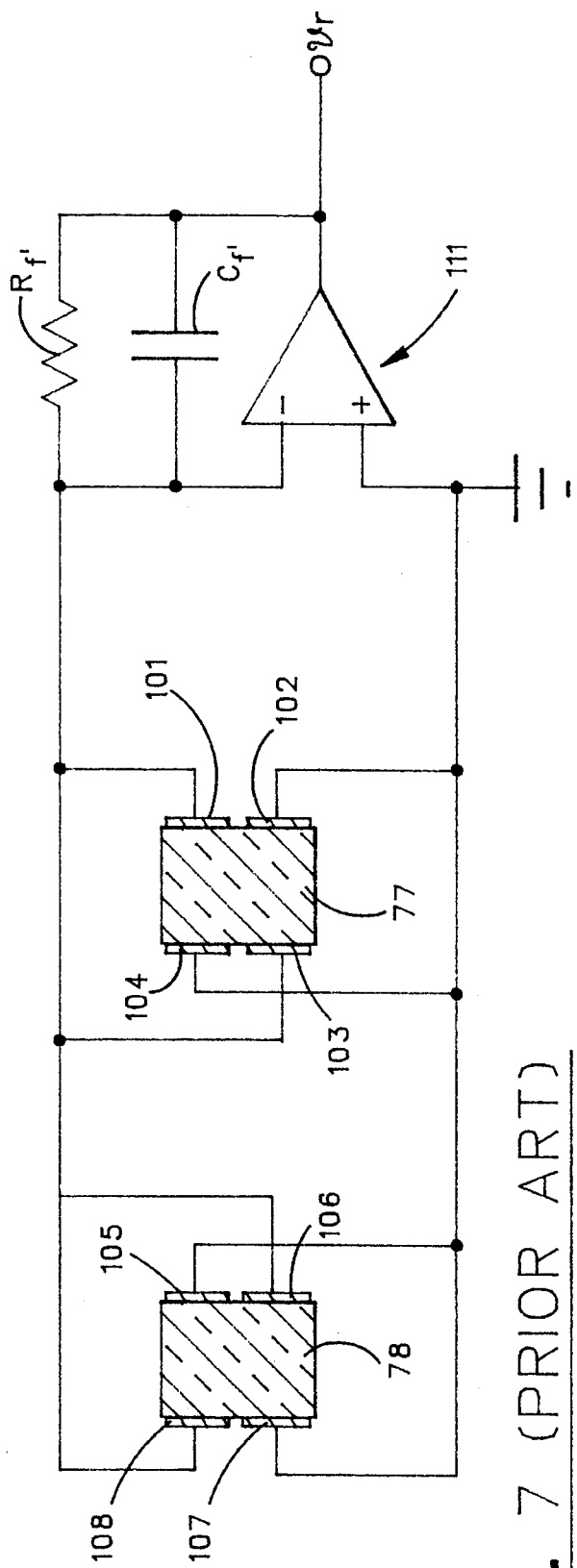
FIG. 7 is a cross-section of pick-up tines of the quartz angular-rate sensor of FIG. 4 along section line 7—7 in FIG. 4.
Figure 8:
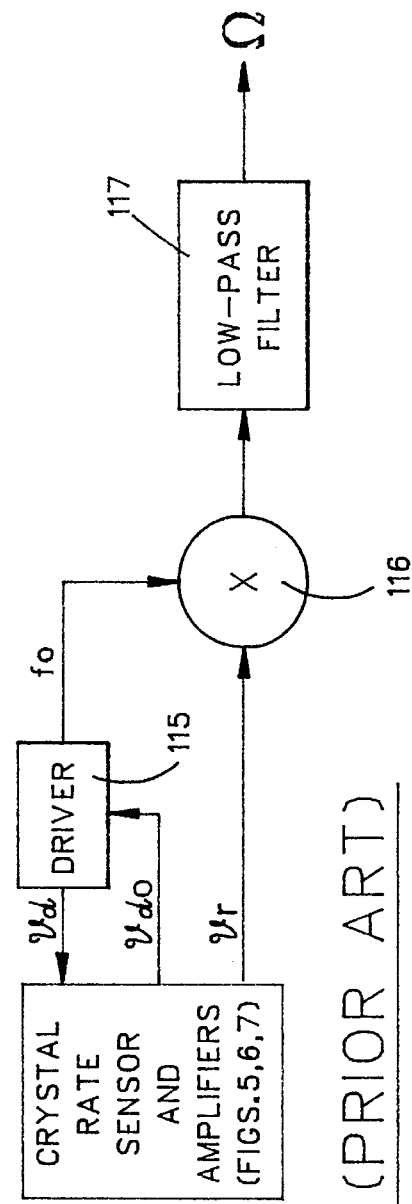
FIG. 8 is a block diagram of a conventional system for exciting the quartz angular-rate sensor of FIG. 4 and synchronously detecting an angular-rate signal.

Turning now to FIG. 8, there is shown a conventional circuit for obtaining an angular-rate signal $\Omega$ from the quartz rate sensor and amplifiers as shown in FIGS. 5, 6, and 7. A driver circuit 115 is responsive to the signal $v_{do}$ to produce a drive signal $v_d$ at the resonant frequency of oscillation of the drive tines (75, 76 in FIG. 4). Moreover, the driver circuit 115 insures that the amplitude of vibration of the drive tines 75, 76 is substantially constant. Further, the driver 115 supplies a signal at the frequency of oscillation $f_o$ to a synchronous detector 116, such as a balanced modulator, that modulates the pick-up signal $v_r$ to detect the angular-rate information. A low-pass filter 117 extracts the angular-rate signal $\Omega$ from the output of the synchronous detector 116.

Figure 9:
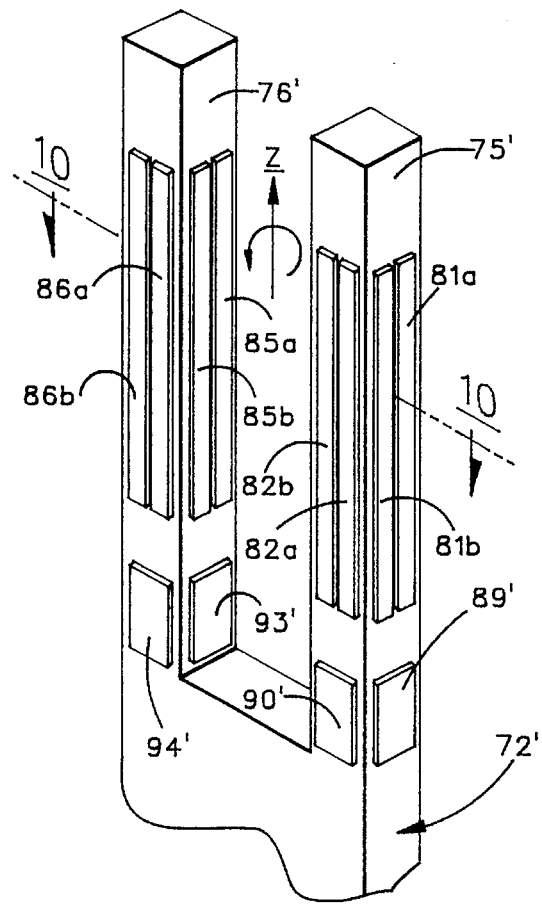
FIG. 9 is a perspective view showing an alternative construction for electrodes on drive tines of a quartz angular-rate sensor.
Figure 10:
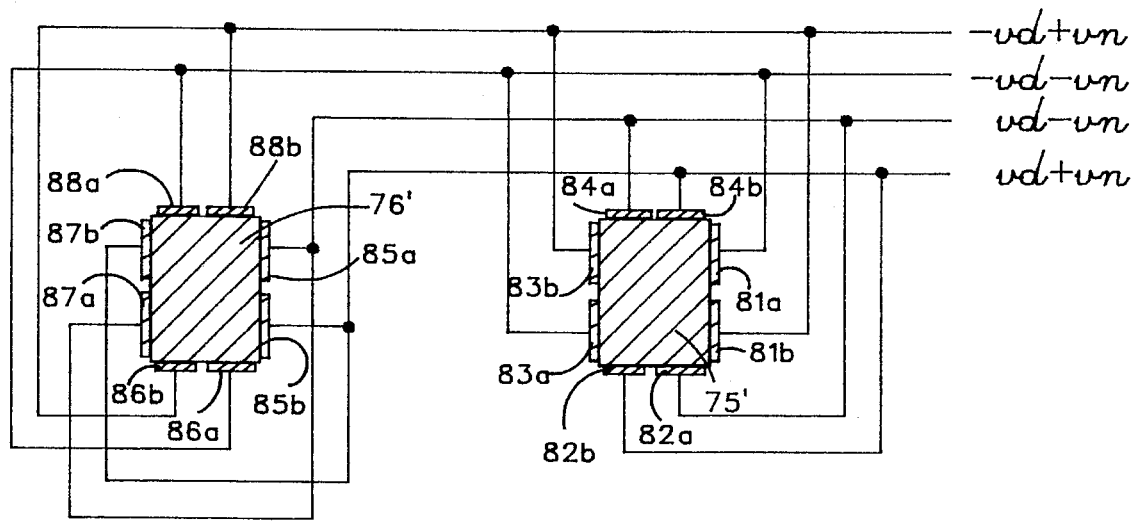
FIG. 10 is a cross-section of the drive tines of the quartz angular-rate sensor of FIG. 9 along section line 10—10 of FIG. 9.

Turning now to FIG. 9, there is shown an alternative construction in which pairs of drive electrodes 81a, 81b, to 88a, 88b, are deposited on the drive tines 75', 76', as further shown in FIG. 10. In this alternative construction, the drive electrodes 81a, 81b, to 88a, 88b are excited with a nulling signal $v_n$ in addition to the drive signal $v_d$. The nulling signal $v_n$ excites vibrations of the drive tines 75', 76' that directly couple to the pick-up tines (not shown), and therefore the nulling signal can be adjusted to minimize or null the vibration of the pick-up tines 77, 78.

Figure 11:
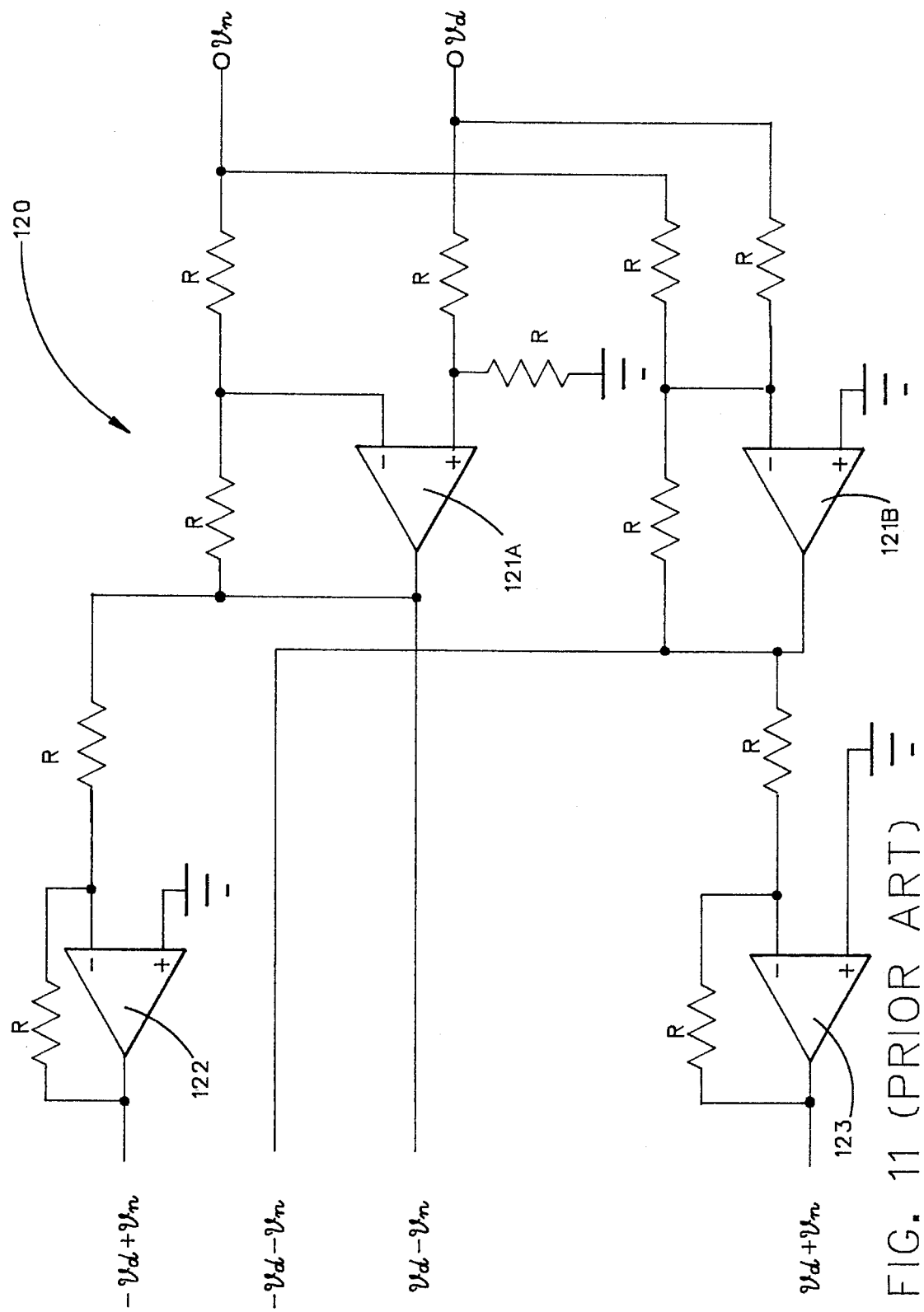
FIG. 11 is a schematic diagram of analog computational circuits for computing drive signals for the drive electrodes as shown in FIG. 10.

As shown in FIG. 11, analog computational circuits 120 receive a single-ended drive signal $v_d$ and a single-ended null signal $v_n$ to produce electrical signals ($-v_d+v_n$, $-v_d-v_n$, $v_d-v_n$, $v_d+v_n$) that are applied to the pairs of drive electrodes (81a, 81b, to 88a, 88b in FIG. 10). These analog computational circuits 120 include an operational amplifier 121A wired as a differential amplifier, an operational amplifier 121B wired as an inverting summing amplifier, an operational amplifier 122 wired as an inverting unity gain amplifier, and an operational amplifier 123 wired as an inverting unity gain amplifier.

Figure 12:
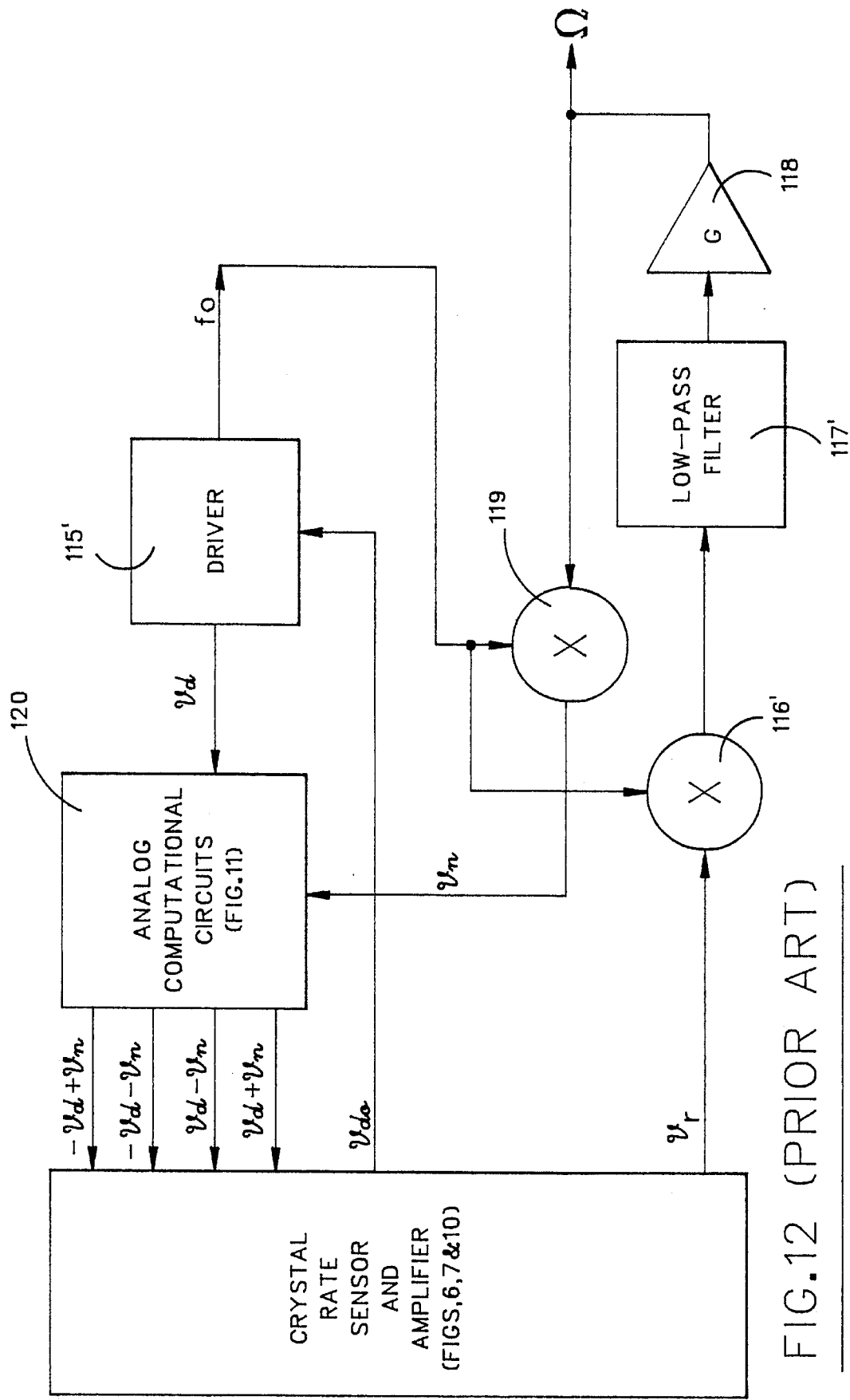
FIG. 12 is a conventional circuit for exciting the quartz angular-rate sensor of FIG. 9 and synchronously detecting an angular-rate signal.

When the quartz angular-rate sensor is operated such that a null signal $v_n$ nulls out the pick-up signal $v_r$, the quartz rate sensor is said to be operated in a "closed loop" mode. A circuit for operating the crystal rate sensor in such a "closed-loop" mode is shown in FIG. 12. The circuit includes a driver 115', a synchronous detector 116', and a low-pass filter 117' that are similar to the driver 115, synchronous detector 116, and low-pass filter 117 introduced in FIG. 8. However, the circuit in FIG. 12 further includes a baseband servo equalizer and feedback amplifier 118, a balanced modulator 119 for supplying the null signal $v_n$ at the frequency of oscillation $f_o$ but having an amplitude controlled by negative feedback to null out the pick-up signal $v_r$, and the analog computational circuits 120 shown in FIG. 11. Therefore, the amplifier 118 provides the angular-rate signal $\Omega$.

Figure 13:
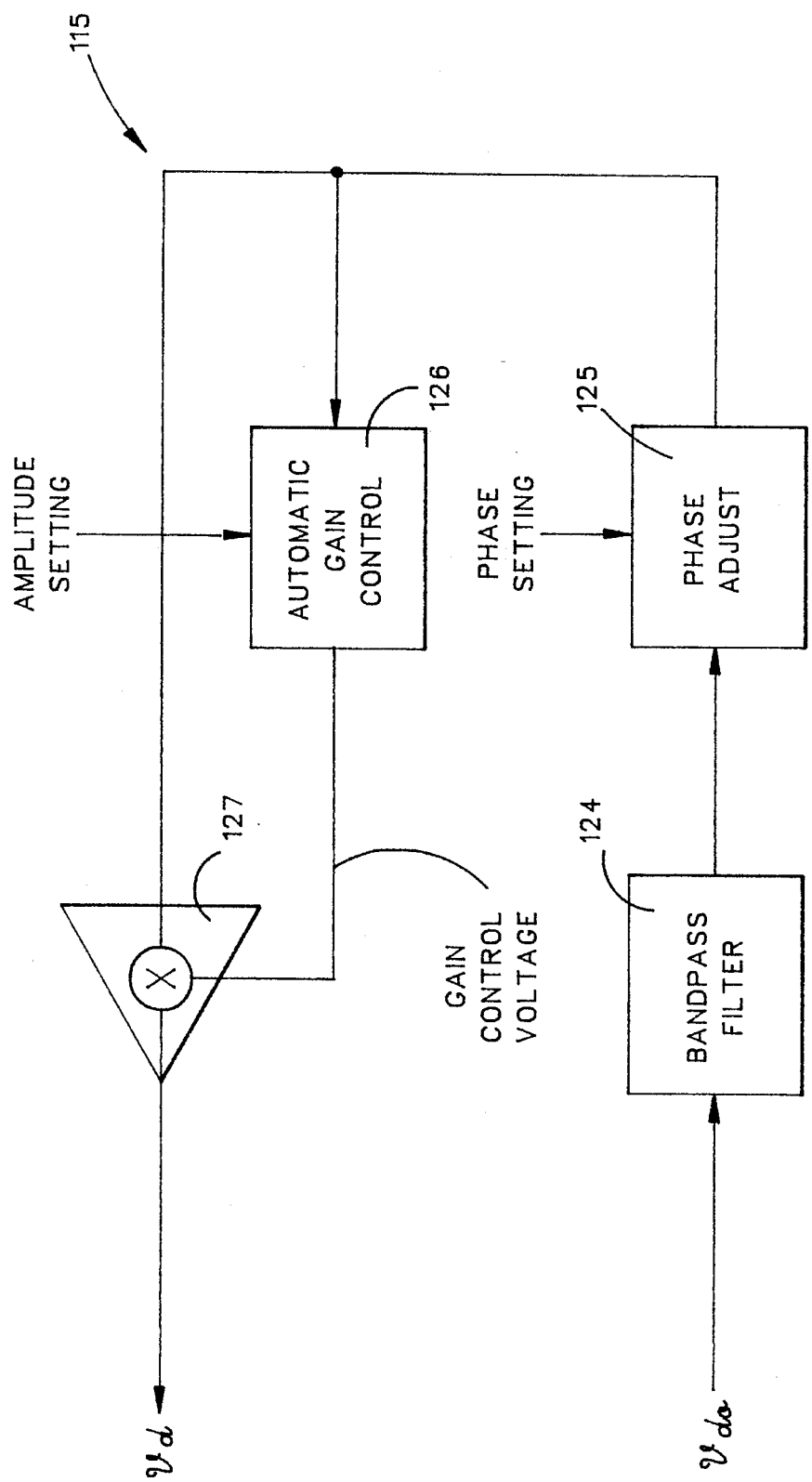
FIG. 13 is a block diagram of an analog drive circuit used in FIG. 12 for exciting the quartz angular-rate sensor.

Turning now to FIG. 13, there is shown a block diagram for the driver circuit 115 of FIG. 8. The driver circuit 115 includes a bandpass filter 124 that filters the $v_{do}$ signal and is tuned for a maximum response at the resonant frequency $f_o$ of the drive tines. The output of the bandpass filter 124 is fed through a phase-adjusting circuit 125 that is adjusted for (360)(n) degree (n is any integer) phase shift around the entire drive loop, through the drive electrodes (81 to 88 in FIGS. 4 and 5), through the physics of the drive fork, through the drive sensing electrodes (89 to 96 in FIGS. 4 and 6), and through the electronics in FIG. 13. The output of the phase-adjusting circuit is fed to an automatic gain control 126 that senses the amplitude of the signal from the phase-adjusting circuit and generates a gain control voltage responsive to the difference between the amplitude of the signal from the phase-adjusting circuit 125 and an amplitude setting. The amplitude setting may be adjusted, for example, in response to calibrating the angular-rate sensor by subjecting the sensor to a precise rate of angular rotation and adjusting the amplitude setting so that the angular-rate signal $\Omega$ precisely indicates the rate of angular rotation. The gain-control voltage from the automatic gain control adjusts the gain of a linear amplifier 127 that amplifies the output of the phase-adjusting circuit 125 to produce the drive signal $v_d$. The linear amplifier, for example, is an operational transconductance amplifier, such as RCA part No. CA3080.

Figure 14:
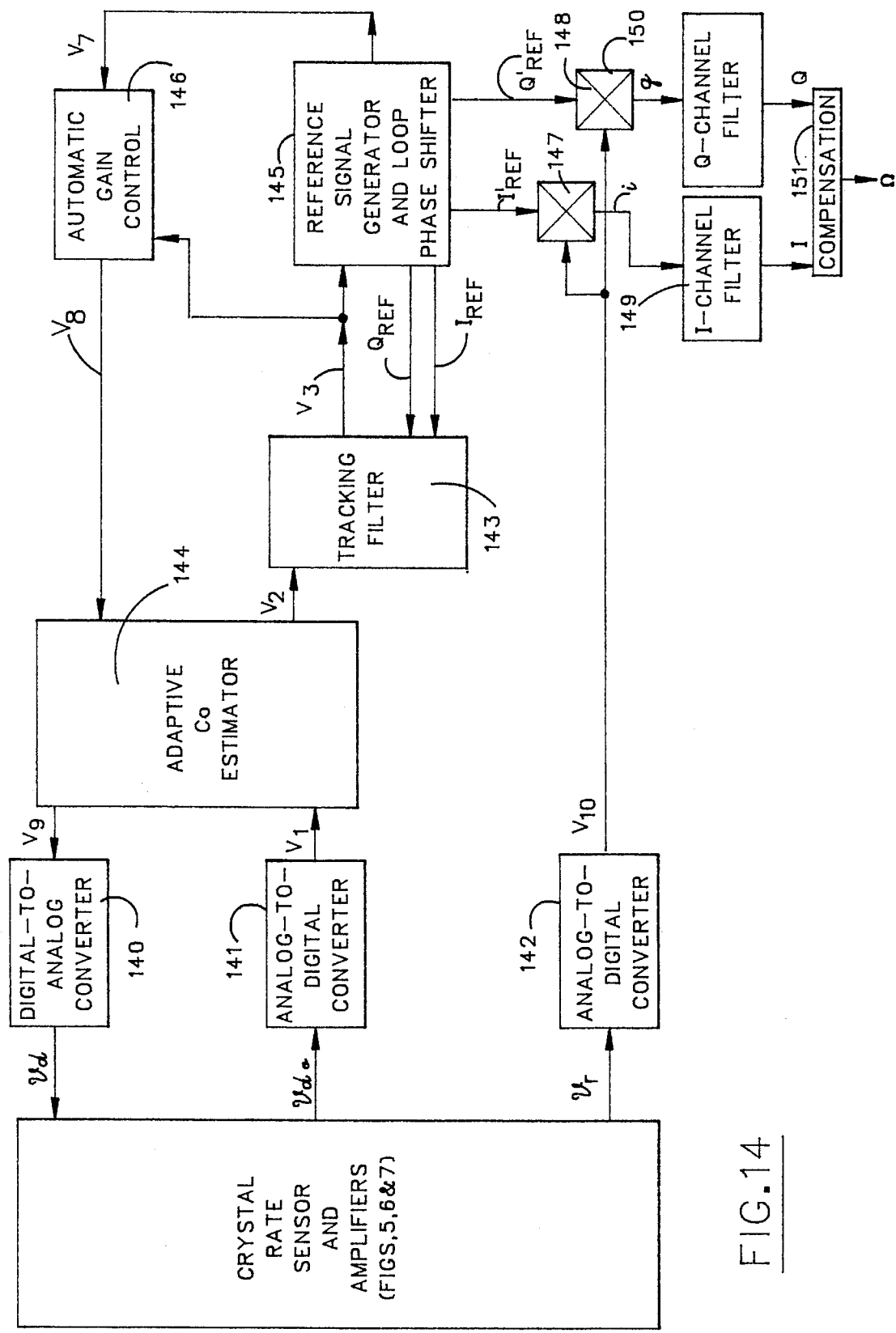
FIG. 14 is a block diagram of a quartz rate sensor system using digital signal processing in accordance with the present invention.

Turning now to FIG. 14, there is shown a block diagram of a quartz rate sensor system using digital signal processing in accordance with the present invention. The drive signal $v_d$ to the quartz rate sensor is produced by a digital-to-analog converter 140 in response to a digital value $v_9$. The digital-to-analog converter 140, for example, is a 16-bit monolithic voltage output D/A converter such as Analog Devices part no. AD569, or an Analog Devices 18-bit digital-to-analog converter part no. AD1139. The output voltage $v_{do}$ indicating the level of excitation of the quartz rate sensor is sampled by an analog-to-digital converter 141 to produce a digital signal $v_1$. In a similar fashion, the pick-off signal $v_r$ is sampled by an analog-to-digital converter 142 to produce a digital signal $v_{10}$. The analog-to-digital converter 141 and the analog-to-digital converter 142, for example, are 16-bit 100k SPS sampling analog-to-digital converters, such as the Analog Devices part no. AD676, which uses a switched-capacitor/charge redistribution architecture. The digital-to-analog converter 140, the analog-to-digital converter 141, and the analog-to-digital converter 142 are all clocked in synchronism at a fixed sampling rate, which is, for example, 42 kHz. For the inertial measurement unit as shown in FIG. 1, the circuit as shown in FIG. 14 is replicated three times, and all of the digital-to-analog converters and analog-to-digital converters are clocked in synchronism by a common system clock (not shown) which is external to the inertial measurement unit 50. The system clock, for example, is part of an avionics package that receives the angular rate and linear acceleration information from the inertial measurement unit 50.

Aside from the quartz rate sensor and amplifiers, and the digital-to-analog converter 140 and the analog-to-digital converters 141, 142 in FIG. 14, all of the other components are synchronous digital logic circuits which could be implemented as either a programmed data processor or as hard-wired logic, for example, in an application-specific integrated circuit. The synchronous digital circuits, for example, could be implemented in a Star Semiconductor SPROC programmable digital signal processing (DSP) integrated circuit which is designed for fixed-point 24-bit arithmetic.

In order to excite the quartz rate sensor at the resonant frequency of the drive tines (75 and 76 in FIG. 4), the digital circuitry in FIG. 14 includes an adaptive $C_o$ canceler 144 for canceling undesired effects of shunt capacitance $C_o$ of the drive tines, a tracking filter 143 that tracks the resonant frequency of the drive tines, a reference signal generator and loop phase shifter 145, and an automatic gain control 146.

The adaptive $C_o$ canceler 144 adds a correction signal to the output $v_1$ of the analog-to-digital converter 141 in order to cancel a similar signal passing from the drive signal $v_d$ and through the shunt capacitance $C_o$ of the drive tines and appearing in the input signal $v_{do}$.

The signal $v_{do}$ includes a noise-contaminated demodulation reference signal that is slowly drifting in frequency. The tracking filter 143 automatically adjusts its passband width and passband center frequency in order to extract the demodulation reference signal. As will be further described below with reference to FIG. 15A, the tracking filter 143 is part of a tracking loop that tracks the frequency of the demodulation reference signal and that reduces the passband width of the tracking filter when the demodulation reference signal is detected. Therefore, the output $v_3$ of the tracking filter 143 is a very clean sinusoid.

The reference signal generator and loop phase shifter 145 provides two reference signals $I'_{REF}$ and $Q'_{REF}$ which are exactly 90° apart in phase, in order to demodulate the angular rate signal $\Omega$ from the pick-off signal $v_r$. The reference signal generator and loop phase shifter 145 also provides exactly an integral number n times 360° of phase shift around the drive loop. Therefore the drive tines of the quartz rate sensor are driven at their resonant frequency, which occurs when there is zero phase shift through the drive tines.

The automatic gain control 146 provides exactly unity gain around the drive loop by exciting the drive tines so that the reference frequency signal extracted by the tracking filter 143 has a constant amplitude.

In order to demodulate the angular rate signal $\Omega$ from the pick-off signal $v_r$, a first multiplier 147 multiplies the signal $v_{10}$ from the analog-to-digital converter 142 by the in-phase reference signal $I'_{REF}$ to produce an in-phase product value (i), and a second multiplier 148 multiplies the signal $v_{10}$ by the quadrature-phase signal $Q'_{REF}$ to produce a quadrature-phase product value (q). The in-phase value (i) is received in an I-channel filter 149, which is a conventional decimating digital low-pass filter, to provide a filtered value I at a lower rate such as 600 Hz. In a similar fashion, the quadrature-phase value (q) is received in a Q-channel filter 150, which also is a conventional digital low-pass decimating filter, to provide a filtered value Q at a lower rate such as 600 Hz.

Because the circuit of FIG. 14 provides both in-phase and quadrature-phase detected signals, any phase shift or tuning error between the reference signal $I_{REF}$ at the frequency $f_o$ and the suppressed carrier in the pick-off signal $v_r$ can be corrected by a rotation of the complex vector I+iQ, and this rotation is performed by a numerical phase adjustment in the reference signal generator 145, as will be described below with reference to FIG. 20. For example, all of the detected angular-rate signal should appear in the in-phase channel I of FIG. 14. In practice, however, there will be some phase offset causing some of the angular-rate signal to appear in the quadrature-phase channel Q.

In general, the angular-rate signal $\Omega$ should have a sign that is the sign of the signal in the in-phase channel I and a corrected magnitude equal to the square root of $I^2+Q^2$. In fact, imperfections within the instrument, alignment errors, and capacitive coupling cause extraneous contributions to the I and Q signals which should be eliminated by calibration and post-processing by computing $\Omega$ from the signals I and Q after removal of the extraneous contributions. Compensation 151 for the extraneous contributions could be performed by referencing calibration data retrieved from calibration tables programmed in non-volatile memory.

Figure 15A:
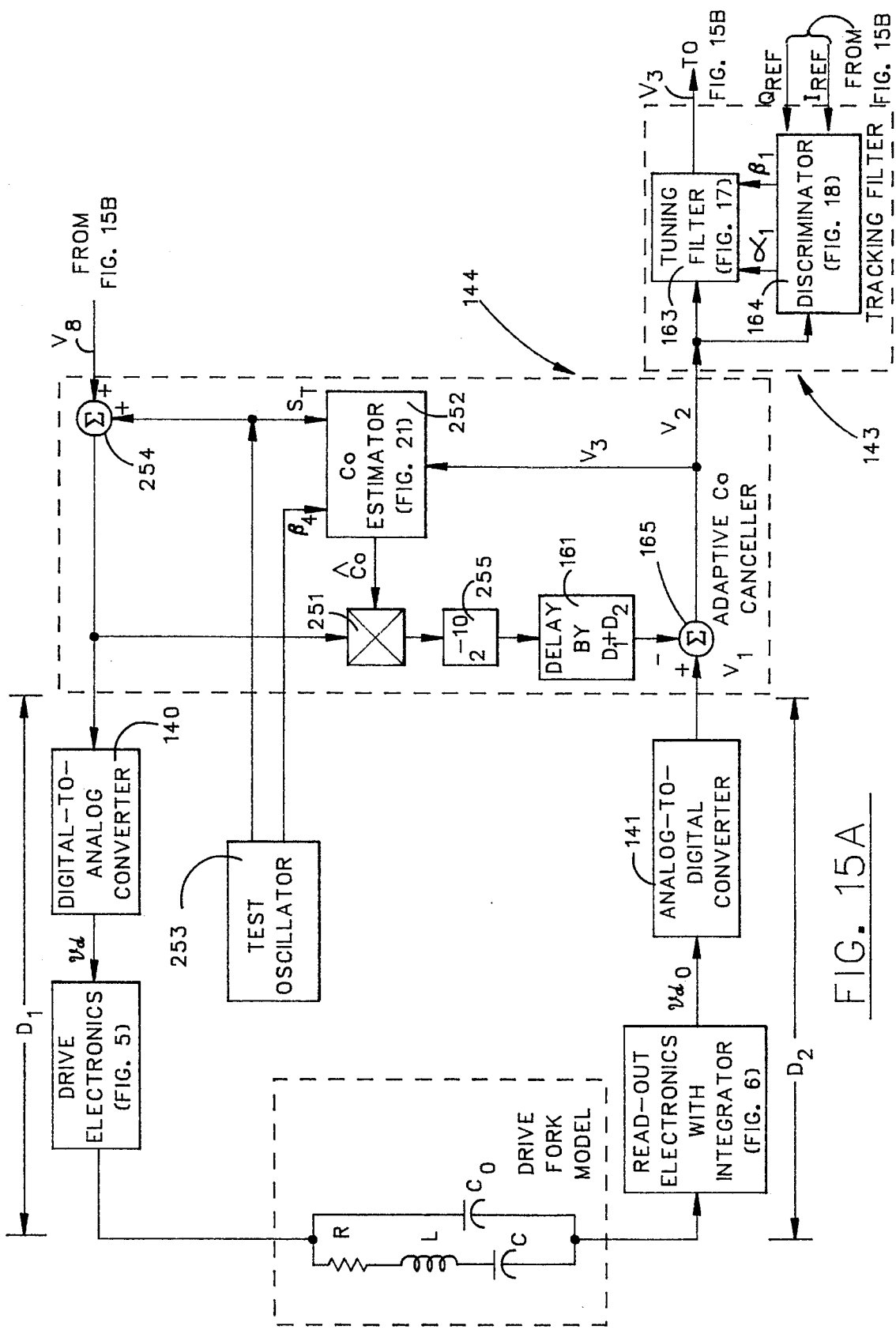
FIGS. 15A and 15B together comprise a more detailed block diagram of the driver circuits for the quartz angular-rate sensor system of FIG. 14.
Figure 15B:
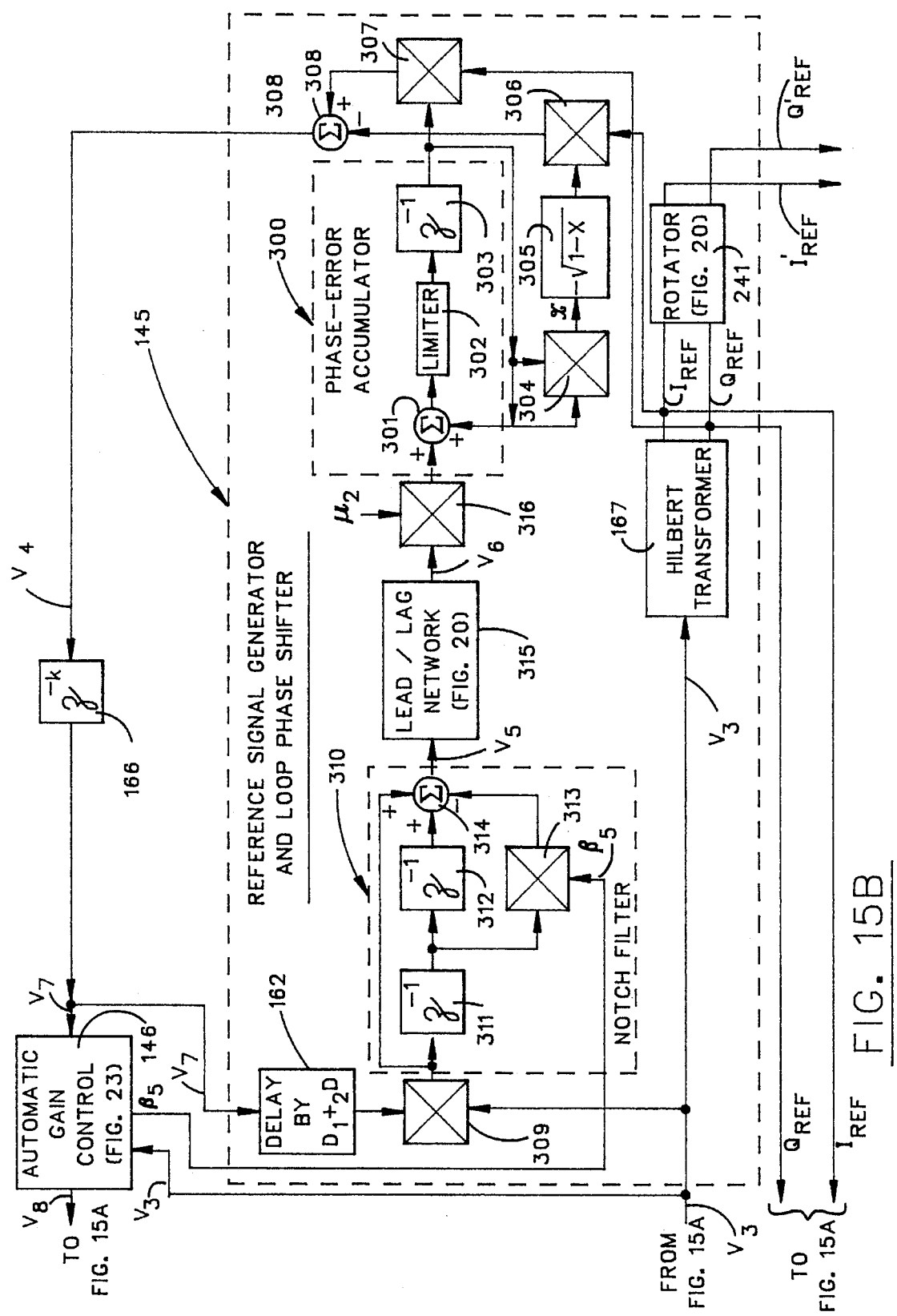

Turning now to FIGS. 15A and 15B, there is shown a more detailed block diagram of the drive loop. As shown in FIG. 15A, the drive fork is electrically modeled by the shunt capacitance $C_o$ representing primarily inter-electrode capacitance, and a series resistance $R_d$, a series inductance $L_d$, and a series capacitance $C_d$. The resonant frequency of the drive fork is determined primarily by the product of the series inductance $L_d$ and the series capacitance $C_d$.

As further shown in FIG. 15A, the drive electronics of FIG. 5 and the digital-to-analog converter 140 are modeled as a time delay $D_1$. In a similar fashion, the read-out electronics with its integrator of FIG. 6, and the analog-to-digital converter 141, are modeled as having a combined delay of $D_2$. The sum of $D_1$ and $D_2$ represents a delay $D_1+D_2$ that is measured for a signal at the nominal drive resonant frequency and is then assumed to be constant. This constant value of $D_1+D_2$ is divided by the sampling periods $T=1/f_s$, where $f_s$ is the sampling frequency of the analog-to-digital converter 141, to express the total delay $D_1+D_2$ as an the sum of an integer i and a fraction $\delta$ in units of T. The integer i determines the maximum number of storage registers that are used in each of a delay block 161 in the adaptive $C_o$ canceler, and in a delay block 162 in the reference signal generator and loop phase shifter 145 as shown in FIG. 15B.

Figure 16:
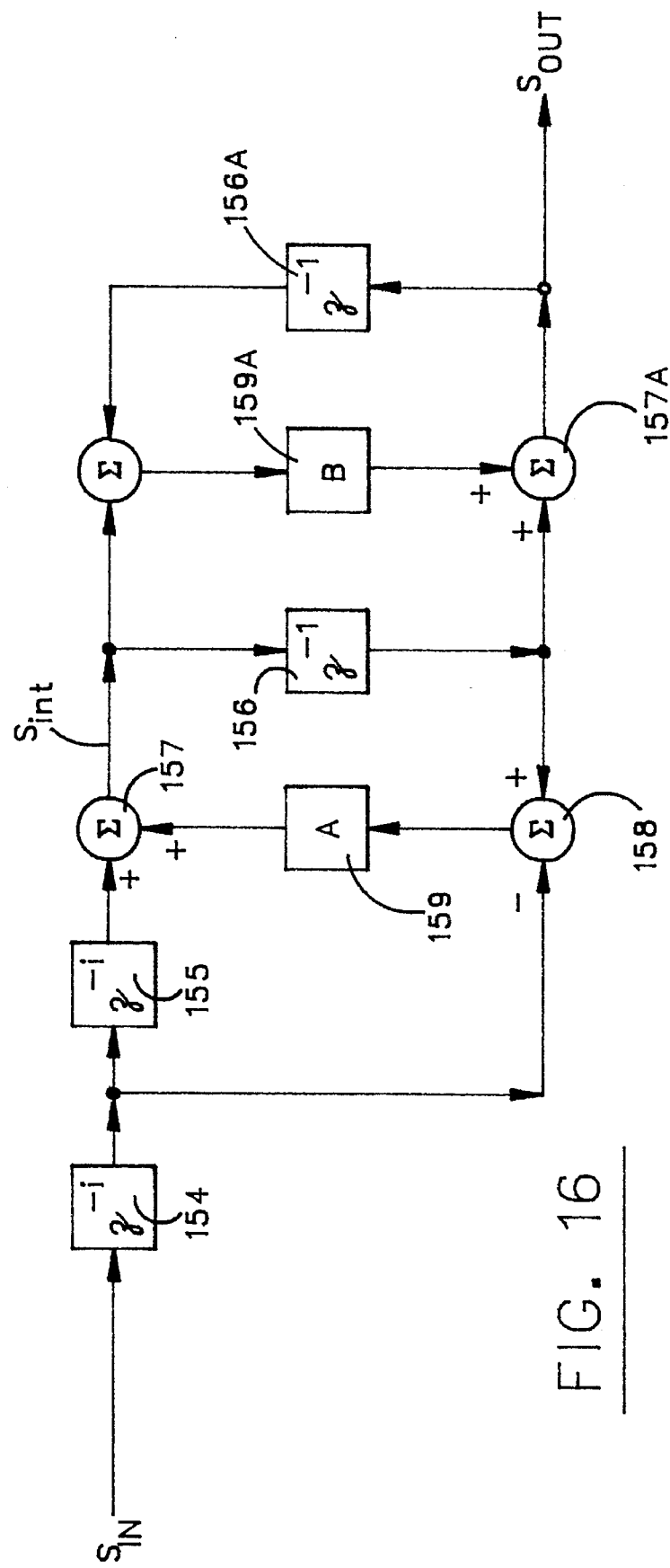
FIG. 16 is a block diagram of a delay unit for providing a delay that is not an integral number of sampling periods.

Turning for a moment to FIG. 16, there is shown a schematic diagram of a circuit for the delay block 161, which is identical to the delay block 162. The delay block 161 includes a delay unit 154 for delaying the input signal $S_{IN}$ by i periods of T. The delay unit 161 is conventional, and includes, for example, i registers clocked in synchronism at the sampling frequency $f_s$ and connected in a shift-register arrangement. The delay unit 161 further includes a delay unit 155 that provides an additional delay of one sample period T. The delay unit 155, for example, includes a single register. To provide an output signal $S_{OUT}$ approximating the input signal $S_{IN}$ delayed by $(i+\delta)T$, the output signal $S_{OUT}$ is computed by interpolation between the output of the delay unit 154 and the output of the delay unit 155. As shown in FIG. 16, for example, a scaling unit or multiplier 159 scales the difference between the output of the delay unit 154 and a delay unit 156 by a factor of A. A summer or adder 157 adds the output of the delay unit 155 to the output of the scaling unit 159 to produce an intermediate signal $S_{int}$. The intermediate signal $S_{int}$ is delayed for one sampling period T in the delay unit 156. A subtractor 158 subtracts the output of the delay unit 154 from the output of the delay unit 156 to produce the input to the scaling unit 159. A subtractor 158A subtracts the intermediate signal $S_{int}$ from the output of delay element 156A. An adder 157A combines the output of delay unit 156 and the output of the scaling unit 159A to generate the signal $S_{OUT}$. The input to delay element 156A is $S_{OUT}$; the input to multiplier 159A is the output of subtractor 158A. The components 155 to 159 and 156A to 159A in FIG. 16 therefore comprise an all-pass filter that provides a phase shift that approximates the required fractional delay of $\delta T$.

Returning now to FIG. 15A, the tracking filter 143 includes a tuning filter 163 and a discriminator 164. The passband width of the tuning filter 163 is controlled by a parameter $\alpha_1$, and the passband-center frequency of the tuning filter is controlled by a parameter $\beta_1$. The analog-to-digital converter output $v_1$ passes through an adder 165 in the adaptive $C_o$ canceler 144 to become a signal $v_2$ which is in turn the input to the tuning filter 163. The tuning filter output is signal $v_3$.

The signal $v_3$ drives a Hilbert transformer 167, which is a kind of non-recursive digital filter that is a very precise 90° phase-shifting network. An example of the Hilbert transformer is further described below with reference to FIG. 19. The Hilbert transformer provides an in-phase reference $I_{REF}$, which is a delayed copy of the input signal $v_3$, and a quadrature-phase output $Q_{REF}$ that lags the in-phase reference $I_{REF}$ by 90°. These two reference signals $I_{REF}$ and $Q_{REF}$ are fed back to the discriminator 164 in the tracking filter 143 of FIG. 15A.

Figure 17:
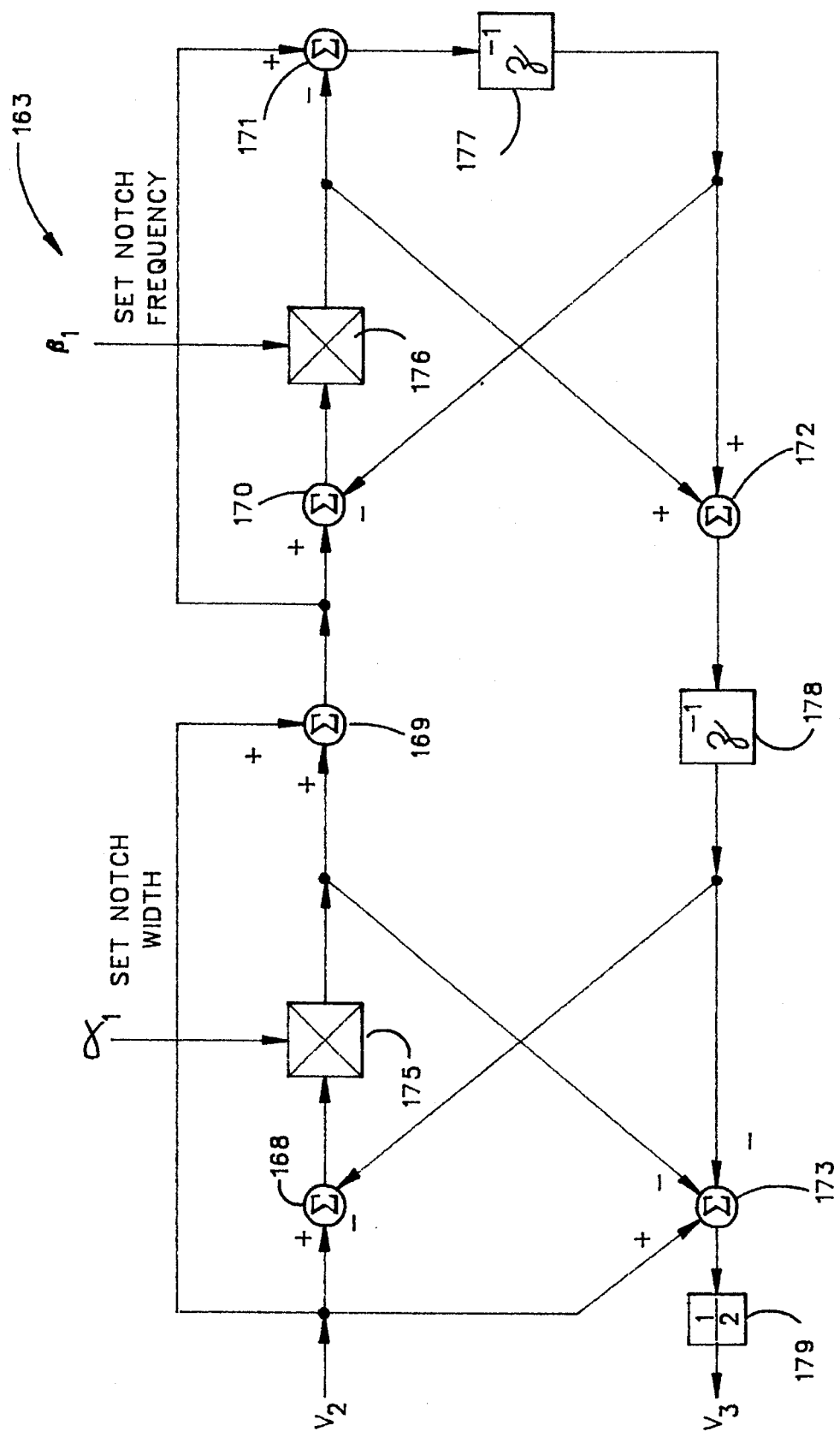
FIG. 17 is a schematic diagram of a tuning filter introduced in FIG. 15A.

Turning for a moment now to FIG. 17, the tracking filter 163 is shown in greater detail. It should be noted that the symbols in FIG. 17 are conventional symbols for representing a digital filter. An adder or subtractor unit is designated by a circle including the Greek letter $\Sigma$ and the input nodes being labeled plus or minus. The tracking filter in FIG. 17, for example, includes six such summing nodes 168, 169, 170, 171, 172, and 173. A multiplier is designated by a box circumscribing an X, such as the multipliers 175 and 176 in FIG. 17, which multiply by $\alpha_1$ and $\beta_1$, respectively. A delay by a fixed integral number n of sampling periods T is denoted by a box including the z transform symbol $z^{-n}$. The blocks 177 and 178, for example, each provide a delay of one sampling period T, which is produced, for example, by a register storage and recall operation in a programmed digital signal processor. A scaling by a fixed constant is represented by a box including the constant. The tracking filter 163, for example, includes a box 179 representing a scaling of one-half, which is conveniently obtained by an arithmetic right shift operation in a programmed digital signal processor.

Figure 18:
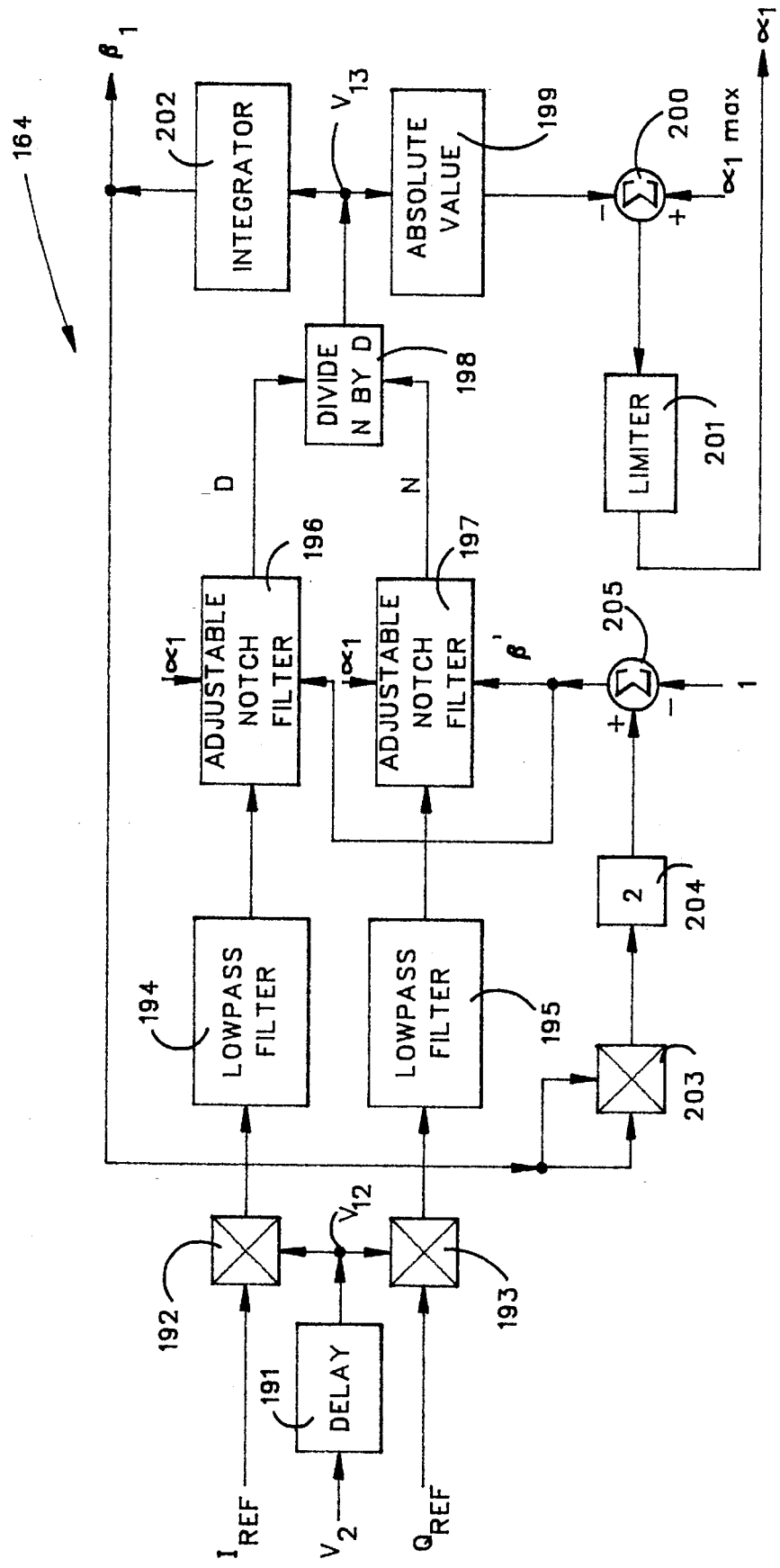
FIG. 18 is a schematic diagram of a discriminator introduced in FIG. 15A.

Turning now to FIG. 18, there is shown a schematic diagram of the discriminator 164. The input signal $v_2$ is delayed in a delay unit 191 such as a shift register having a delay that is the delay to the center tap of the Hilbert transformer 167 of FIG. 15B. For example, the Hilbert transformer 167 provides a delay of nine sampling periods T. Therefore, in this example, the delay unit 191 should provide a delay of nine sampling periods T.

In any case, the phase shift between the output signal $v_{12}$ of the delay unit 191 and the reference signal $I_{REF}$ is zero when the passband center-frequency of the tuning filter (163 in FIG. 17) is tuned to frequency of the signal $v_{12}$. When the passband center-frequency of the tuning filter is not tuned to frequency of the signal $v_{12}$, then there will be a phase shift between the signal $v_{12}$ and the reference signal $I_{REF}$, and this phase shift will be an indication of the tuning error of the tuning filter. Therefore, the discriminator 164 in FIG. 18 can detect any phase shift between the signal $v_{12}$ and the reference signal $I_{REF}$, and adjust the bandpass center-frequency control signal $\beta_1$ in response to the detected phase shift, in order to reduce the phase shift and the tuning error to zero.

Within the discriminator 164, the delayed signal $v_{12}$ is complex-demodulated by the reference signals $I_{REF}$ and $Q_{REF}$ by a pair of multipliers 192, 193, low-pass filtered by low-pass filters 194, 195, and notch-filtered by adjustable notch filters 196, 197 to remove the double-frequency components generated by the multipliers 192, 193. The signal N from the adjustable notch filter 197 is a measure of the tuning error of the tuning filter 63 of FIG. 15A, although its amplitude is also a function of the amplitude of the input signal $v_2$. Therefore, a substantially amplitude-independent tuning error signal is produced by a divider 198 that divides the signal N from the notch filter 197 from the output D of the notch filter 196. Moreover, to prevent an inaccurate result when the output D is approximately zero, the quotient in this case should be forced to zero.

The tuning error signal $v_{13}$ from the divider 198 is a direct candidate for determining the desired passband-width of the tuning filter 163 in FIG. 15A. In particular, the tuning parameter $\alpha_1$ is determined by an absolute value unit 199 which produces the absolute value of the tuning error signal $v_{13}$, a subtractor 200 which subtracts the absolute value from a predetermined constant $\alpha_{1max}$, and a limiter 201 which limits the difference to within reasonable limits, in order to produce $\alpha_1$. The constant $\alpha_{1max}$, for example, has a value of 0.999, and $\alpha_1$ is limited so that $0.4 \leq \alpha_1 \leq 0.999$. In effect, the passband-width control parameter $\alpha_1$ is determined so that the tuning filter 163 is adjusted to have a passband width of at least twice the difference between the frequency of the signal $v_1$ and the frequency of the reference signals $I_{REF}$ and $Q_{REF}$.

The passband frequency parameter $\beta_1$ of the tuning filter 163 is generated by an integrator or accumulator 202 which integrates the tuning error signal $v_{13}$ from the divider 198. (The integrator 202 is similar in construction to the accumulator 338 shown in FIG. 23, and the value of $\beta_1$ is limited to $\pm 1$.) A tuning frequency parameter $\beta'$ for the notch filters 196, 197 is generated from $\beta_1$ by a multiplier 203 which computes the square of $\beta_1$, a scaling unit 204 which scales the square by a factor of two, for example, by a left shift of one binary place, and by a subtractor 205 which subtracts a constant value of one from the output of the scaling unit 204. Each of the adjustable notch filters 196, 197 is similar to the tuning filter 163 as shown in FIG. 17, except that $\beta'$ would be used instead of $\beta_1$, and all of the inputs to the adder 173 would carry plus signs.

Further details regarding the tracking filter 143 are disclosed in the tracking filter design program listed in Appendix I.

Figure 19:
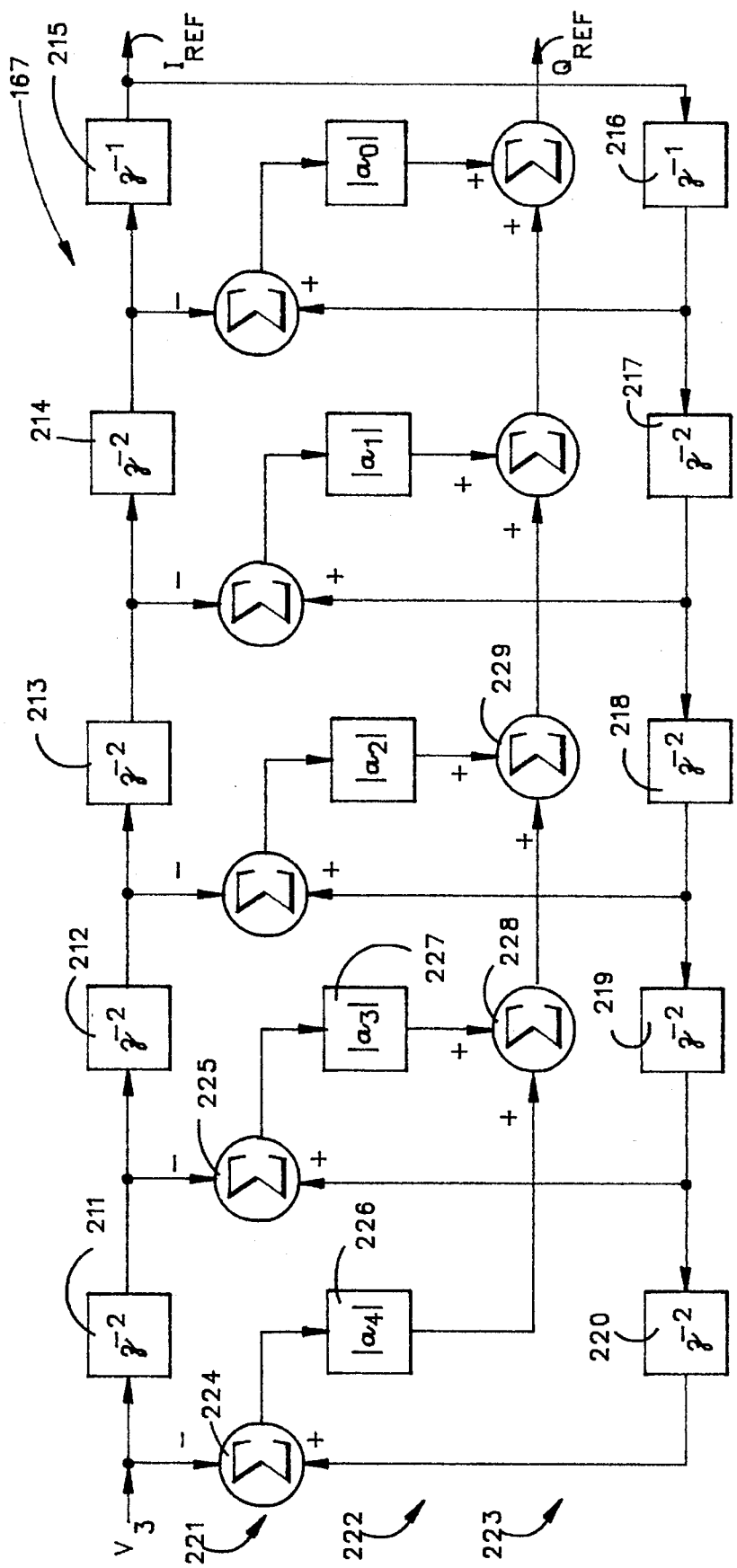
FIG. 19 is a schematic diagram of a Hilbert transformer introduced in FIG. 15B.

Turning now to FIG. 19, there is shown a schematic diagram of the Hilbert transformer 167. The input signal $v_3$ is successively delayed by either two sample periods T or one sample period T by delay units 211–220. The delay units 211–214 and 217–220 each provide a delay of two sampling periods T, and the delay units 215, 216 provide a delay of one sampling period T. The in-phase reference $I_{REF}$ is produced by the output of the delay unit 215. The quadrature-phase reference $Q_{REF}$ is a weighted sum of the input signal $v_3$ and the outputs of the delay units. In particular, a first row of subtractors 221 subtracts a respective one of the input signal $v_3$ or the outputs of one of the delay units 211–214 from the output of a respective one of the delay units 216–220. The differences are scaled by respective coefficients $a_0$–$a_4$ in a row of scaling units 222. The outputs of the scaling units 222 are summed together by a row of adders 223 to produce the quadrature-phase reference signal $Q_{REF}$.

As derived in Appendix II, an appropriate set of coefficients for the Hilbert transformer 167 are as follows:

$a_0$=0.6142410357
$a_1$=0.1529612327
$a_2$=0.0496214228
$a_3$=0.0127215311
$a_4$=0.0018368168

It should be noted that the Hilbert transformer 167 could be modified to increase or decrease the precision of the quadrature-phase reference $Q_{REF}$ with a corresponding increase or decrease in computational complexity. For example, the delay units 211, 212, 219, and 220, their associated subtractors 224, 225, their associated multipliers 226, 227, and their associated adders 228 and 229 could be eliminated, in which case the input signal $v_3$ would feed directly to the delay unit 213. In this case, the Hilbert transformer would use only three multipliers, and the coefficients $a_0$, $a_1$, and $a_2$ would be changed to:

$a_0'$=0.5868816329
$a_1'$=0.099083914
$a_2'$=0.0122024482

The in-phase reference $I_{REF}$ and the quadrature-phase reference $Q_{REF}$ from the Hilbert transformer 167 of FIG. 19 could be used directly for demodulating the pick-off signal $v_r$ from the quartz rate sensor. Preferably, however, a reference phase adjustment is provided by a rotator 241 in FIG. 15B that performs a complex rotation of the reference signals $I_{REF}$ and $Q_{REF}$ through a predetermined compensation angle $\alpha$ to produce a transformed in-phase reference signal $I'_{REF}$ and $Q'_{REF}$.

Figure 20:
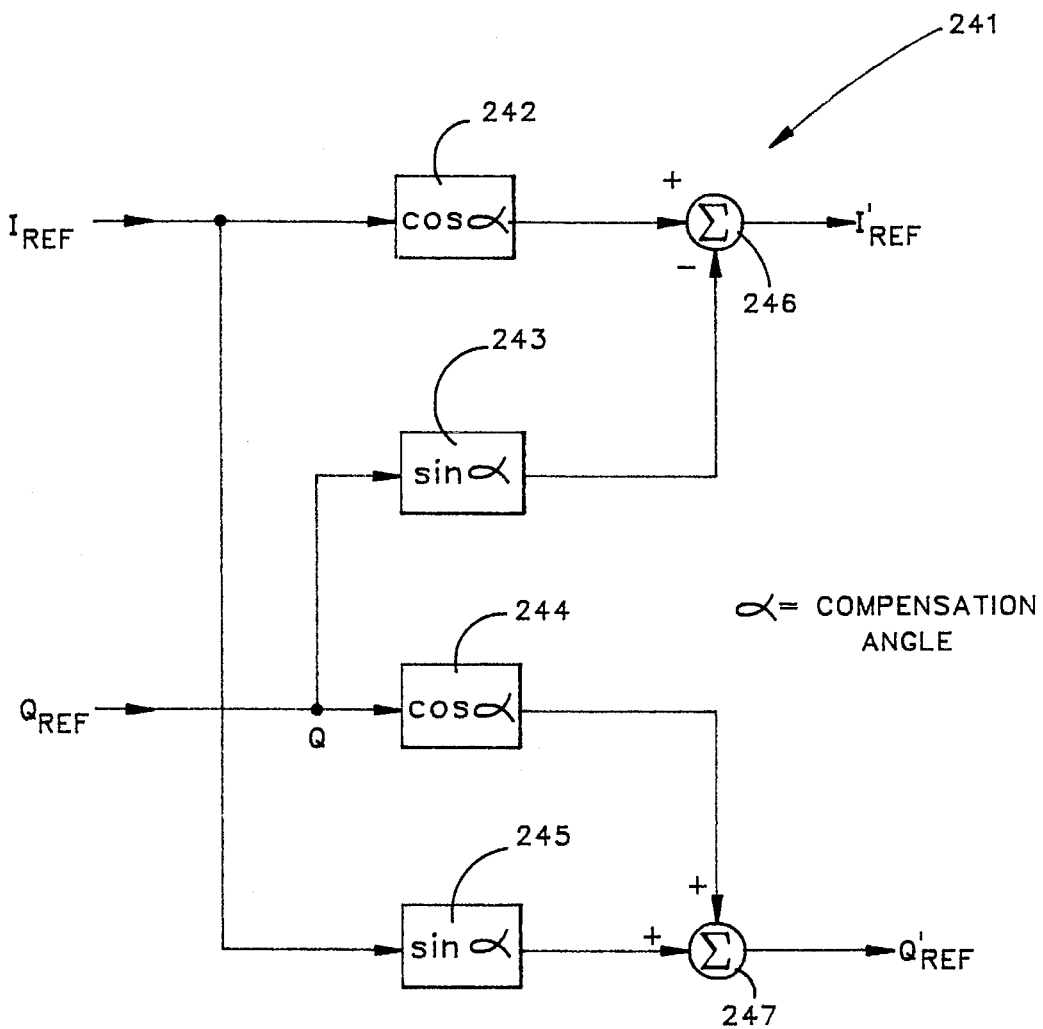
FIG. 20 is a schematic diagram of a rotator introduced in FIG. 15B.

Turning for a moment to FIG. 20, there is shown a schematic diagram of the rotator 241. The complex rotation is provided by four scaling units 242, 243, 244, and 245, a subtractor 246 which produces the transformed in-phase reference signal $I'_{REF}$, and an adder 247 which produces the transformed quadrature-phase reference signal $Q'_{REF}$. The compensation angle $\alpha$ is adjusted during calibration of the system, as described above with reference to FIG. 14, and the sine and cosine of the compensation angle are stored in nonvolatile memory. During the operation of the system, the sign and cosine of the compensation angle $\alpha$ are retrieved from non-volatile memory to be multiplied by the in-phase reference $I_{REF}$ and the quadrature-phase reference $Q_{REF}$ to perform the scaling functions of the scaling units 242, 243, 244, and 245.

Returning now to FIG. 15A, the signal $v_1$ from the analog-to-digital converter 141 is received by the subtractor 165 which subtracts a compensation signal to cancel a signal component from the shunt capacitance $C_o$ of the drive fork. This compensation signal is produced by a multiplier 251 which multiplies a capacitance estimate $\hat{C}_o$ by the signal $v_9$ which is a digital version of the drive signal $v_d$, and a scaler unit 255 which scales the product of the multiplier 251 by a factor of $2^{-10}$, for example, by an arithmetic right shift by ten binary places. In this fashion, the $C_o$ canceler 144 is placed across the digital input and digital output lines between the input of the digital-to-analog converter 140 and the output of the analog-to-digital converter 141. The shunt path from the signal $v_9$ to $v_2$ cancels the shunt capacitive path through the drive fork.

The estimate of the capacitance $\hat{C}_o$ is generated by a $C_o$ estimator 252 responsive to a signal $S_T$ from a test oscillator 253. Preferably the signal $S_T$ from the test oscillator 253 is generated and used continuously for estimating the value of the shunt capacitance $C_o$. A single test oscillator 253 is used for providing the test signal $S_T$ to the three quartz rate sensors in the inertial measurement unit 50 of FIG. 1. A suitable test oscillator will be described below with reference to FIG. 24.

The test oscillator 253 may also supply a tuning parameter $\beta_4$ indicating the frequency of the test signal $S_T$ with reference to the sampling frequency $f_s$. If the tuning parameter $\beta_4$ were not provided by the test oscillator, then it could be generated by a circuit similar to the portion of FIG. 23 including the components 329 to 341 in FIG. 23. Alternatively, the test frequency $S_T$ could be a predetermined fraction of the sampling frequency $f_s$, so that the tuning parameter $\beta_4$ could be a predetermined constant, and therefore need not be supplied by the test oscillator 253.

Since the admittance of the shunt capacitance $C_o$ increases with frequency, it is desirable for the test oscillator 253 to run at the highest practical frequency which is just under one-half of the sampling frequency $f_s$. At that frequency, the net shunt capacitance is $\Delta C_o = C_o - \hat{C}_o$. When the magnitude of the admittance of the net shunt capacitance $\Delta C_o$ is approximately equal to the magnitude of the admittance of the series combination of the series resistance $R_d$, the inductance $L_d$, and the series capacitance $C_d$ in the drive fork model, the equivalent circuit creates a complex-zero pair at the frequency of the test oscillator and the loop stops adjusting. For a 42 kHz sampling frequency, the test frequency would be limited to less than 21 kHz.

In any event, the frequency of the test signal is selected to be different from the resonant frequency $f_o$ of the drive fork, so that the amplitude of the returned signal component of the test signal appearing in the output signal $v_{do}$ is proportional to the shunt capacitance $C_o$. The subtractor 165 determines the difference between the returned signal component of the test signal and a cancellation signal passing through the delay unit 161. The $C_o$ estimator 252 is responsive to this residual signal at the test frequency. Therefore, the $C_o$ estimator can determine the estimate $\hat{C}_o$ that will minimize the residual at the test frequency in the signal $v_3$.

Figure 21:
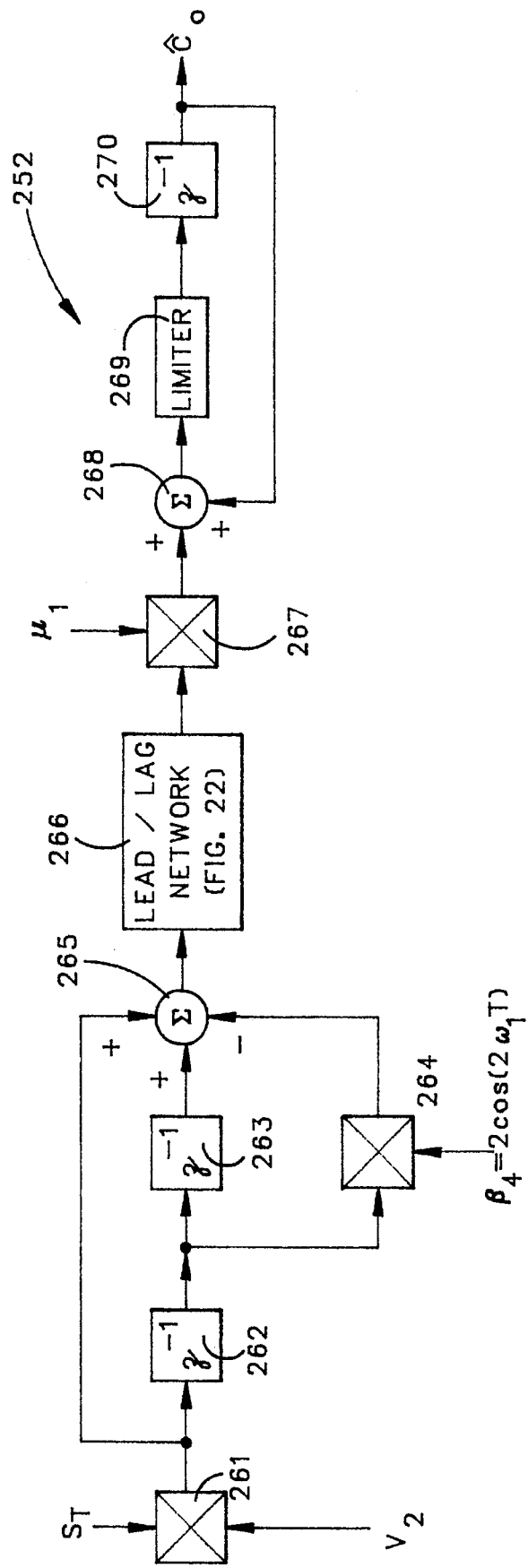
FIG. 21 is a schematic diagram of a shunt capacitance estimator introduced in FIG. 15A.

Turning now to FIG. 21, there is shown a schematic diagram of the $C_o$ estimator 252. A multiplier 261 multiplies the signal $v_2$ by the test signal $S_T$ to detect the residual of the test signal appearing in the signal $v_2$. The double frequency term in the product is filtered out by a notch filter including delay units 262 and 263, a multiplier 264 which multiplies the output of the first delay unit 262 by the tuning parameter $\beta_4$, and an adder 265 which adds the product from the multiplier 261 to the output of the second delay unit 263 and subtracts the product from the multiplier 264. The sum from the adder 265 passes through a lead/lag network 266 which is used for ensuring stability. The lead/lag network will be further described below with reference to FIG. 22. A multiplier 267 scales the output of the lead/lag network by a factor $\mu_1$ that adjusts the loop gain for the estimation of the capacitance $C_o$. The factor $\mu_1$, for example, is $2^{-10}$. The product from the multiplier 267 is averaged in an accumulator including an adder 268, a unit amplitude limiter 269 having an output limited to ±1, and a delay unit or accumulator register 270. The accumulator register 270 provides the scaled capacitance estimate $\hat{C}_o$.

Figure 22:
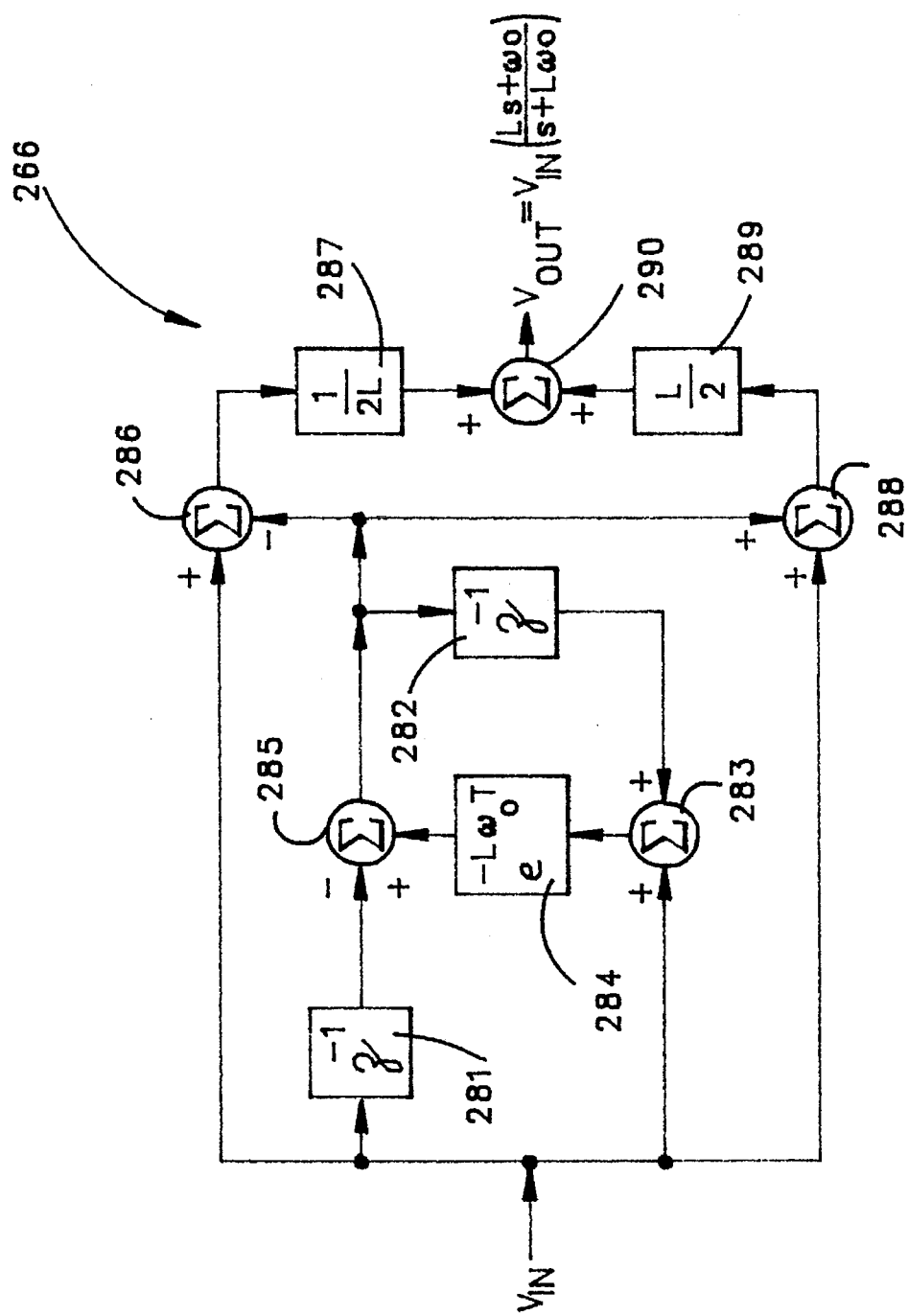
FIG. 22 is a schematic diagram of a lead/lag network introduced in FIG. 19.

Turning now to FIG. 22, there is shown a schematic diagram of the lead/lag network 266 introduced in FIG. 21. The lead/lag network includes a first delay unit 281 which delays the input signal $v_{IN}$ by one sampling period T, and a second delay unit 282 having a delay of one sampling period T and having a feedback path in order to provide the pole in the frequency response of the lead/lag network. A summer 283 sums the output of the second delay unit 282 with the input signal $v_{IN}$, and the sum is scaled by a scale factor having a value of $e^{-L\omega_o T}$ in a scaling unit 284. The parameter L, for example, has a value of 5.9. A subtractor 285 subtracts the output of the first delay unit 281 from the output of the scaler 284 to provide a difference that is received by the second delay unit 282.

In order to produce the output signal $v_{OUT}$ of the lead/lag network 266, a subtractor 286 subtracts the output from the subtractor 285 from the input $v_{IN}$, and a scaling unit 287 scales the difference by the factor of 1/2L. An adder 288 adds the output of the subtractor 285 to the input signal $v_{IN}$, and a scaling unit 289 scales the sum by the factor L/2. Finally, an adder 290 adds the output of the scaling unit 287 to the output of the scaling unit 289 to produce the output signal $v_{OUT}$.

Turning now to FIG. 15B, there are shown further details of the reference signal generator and loop phase shifter 145. To provide exactly an integer number n times 360° of phase shift around loop and zero degrees of phase shift across the drive tines, the reference signal generator and loop phase shifter 145 shifts the signal $v_3$ by an adjustable phase angle to produce the signal $v_7$. The phase shift can be continuously adjusted by up to plus and minus 90° in response to a signal from a phase-error accumulator generally designated 300. The phase-error accumulator 300 has an adder 301, a limiter 302, and a delay unit or accumulator register 303. The limiter 302 limits the value in the delay unit 303 to within plus one and minus one corresponding to the arcsine of the adjustable angle of phase shift. The cosine corresponding to this angle of phase adjustment is computed by a multiplier 304 and a functional unit 305 which computes the square root of one minus x, where x is the square of the sine value. Preferably, the square root of one minus x is computed by an 8-term Chebychev polynomial approximation: where:

$a_0=1$ $$\sqrt{1-x} \approx \sum_{i=0}^{7} a_i x^i$$

$a_1=-0.800044$ hexadecimal $a_2=-0.1FF585$ hexadecimal $a_3=-0.109BC8$ hexadecimal $a_4=-0.05A0C5$ hexadecimal $a_5=-0.178DE2$ hexadecimal $a_6=-0.1B649B$ hexadecimal $a_7=-0.2093C3$ hexadecimal A first multiplier 306 multiplies the in-phase channel reference $I_{REF}$ by the cosine value from the functional unit 305 to produce a first product, and a second multiplier 307 multiplies the quadrature-phase reference $Q_{REF}$ by the sine value from the delay unit 303 to produce a second product. In a subtractor 308, the first product from the first multiplier 306 is subtracted from the second product from the second multiplier 307 to produce a signal $v_4$. An additional phase shift equal to the integer K times 360° $f_o/f_s$ is provided by the delay unit 166. For a sampling frequency of 42 kHz and a nominal drive fork resonant frequency of 10 kHz, the delay unit 166 therefore provides a coarse phase adjustment by phase steps of somewhat less than 90°. This coarse adjustment, however, is all that is necessary so that the phase error can be eliminated by the continuous adjustment made in response to the phase error signal in the phase-error accumulator 300.

The phase-error accumulator 300 is responsive to a phase comparison between the phase of the signal $v_3$ and the phase of the signal $v_7$ after a delay through the delay unit 162. At resonance, there is no phase shift through the drive fork, so that any phase shift that does appear on the signal passing through the drive fork is a measure of the frequency error; i.e., how far the frequency of oscillation is from the resonant frequency of the fork. As illustrated in FIG. 15, there is a phase shift of 90° due to the integrator in the read-out electronics of FIG. 6, and there is a time delay of $D_1$ and $D_2$ from the signal $v_9$ to the signal $v_1$ even when there is a zero phase shift through the drive fork. Therefore, by delaying the signal $v_7$ through the delay unit 162, and comparing the phase of the output of the delay unit 162 with the signal $v_3$ to obtain a 90° phase difference, then the phase across the drive fork can be set to zero, as desired.

A multiplier 309 multiplies the signal $v_3$ by the output of the delay unit 162 to provide a phase-error signal that is zero as desired for a 90° phase difference, and the phase-error accumulator 300 is responsive to this phase error signal so that the servo-action of the phase-error adjustment directs the signal from the delay unit 162 to lead the signal $v_3$ by 90°, thereby pulling the frequency error towards zero. The output of the multiplier 309 is a zero-frequency signal proportional to the phase error, plus a double frequency term that is removed by a notch filter 310. The notch filter 310 includes a first delay unit 311, a second delay unit 312, a multiplier 313, and an adder 314. A lead/lag network 315, similar to the lead/lag network 266 shown in FIG. 22, and a gain scaler 316 provide stable close-loop servo characteristics.

Figure 23:
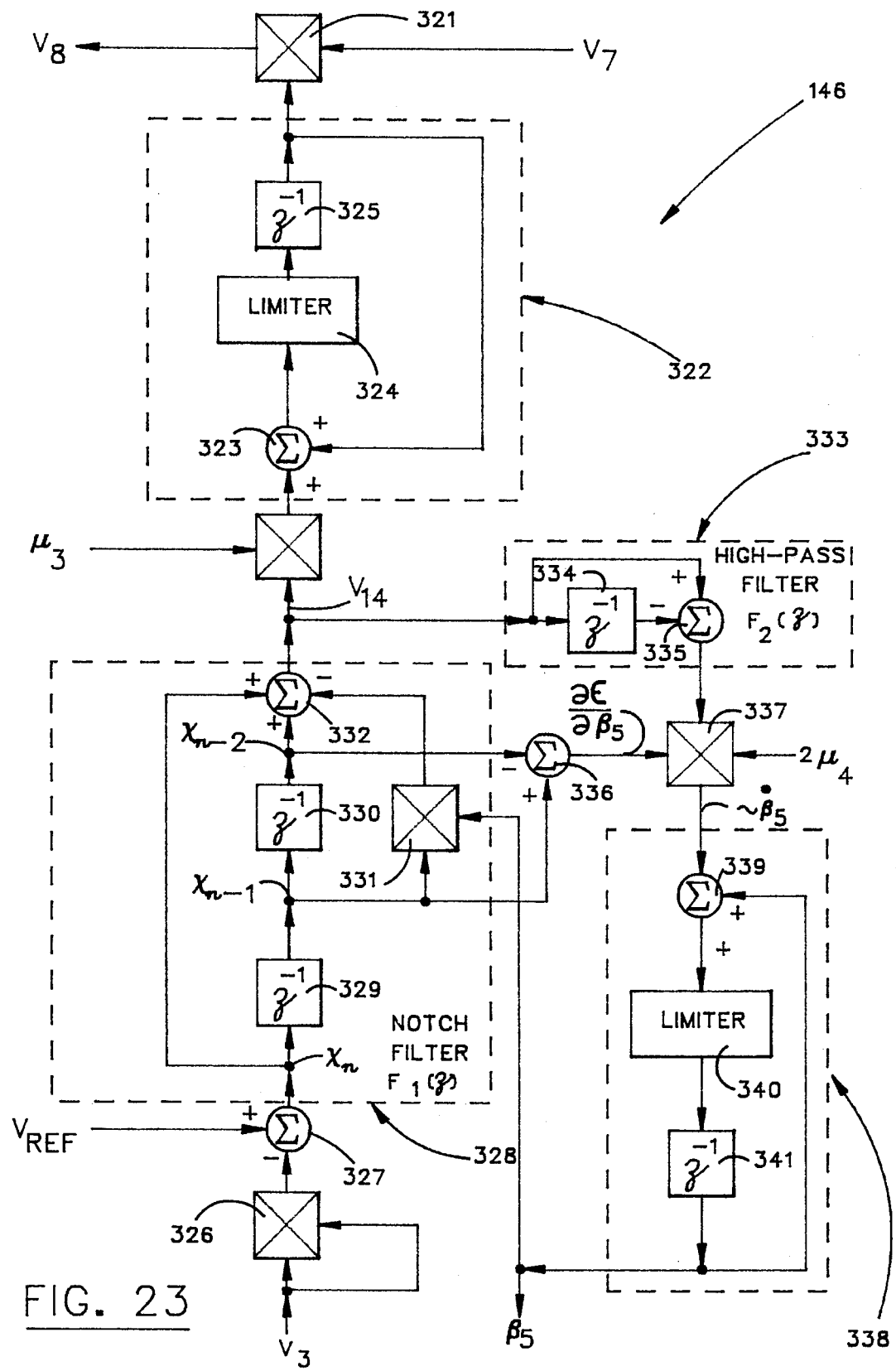
FIG. 23 is a schematic diagram of an automatic gain control introduced in FIG. 15B.

Turning now to FIG. 23, there is shown a schematic diagram of the automatic gain control 146 shown in FIG. 14 and in FIG. 15B. The automatic gain control has a multiplier 321 at the top of the figure that multiplies the signal $v_7$ by a variable gain factor to produce the signal $v_8$. This gain factor is the output of an accumulator generally designated 322, which includes an adder 323, a limiter 324, and a delay unit or accumulator register 325. The accumulator 322 functions as an integrator and lowpass filter. The accumulator 322 is responsive to the error in the comparison of the amplitude of the signal $v_3$ and a reference level set by a reference signal $v_{REF}$. In particular, a multiplier 326 computes the square of the signal $v_3$, and the squared value is subtracted from the reference signal $V_{REF}$ to produce an amplitude error signal. Assuming that the radian frequency of the input signal is $\omega$, the peak amplitude of the signal $v_3$ is A, and the sampling period is T, and the integer n designates the sampling index, then the input signal $v_3(n)$ can be expressed as:

$$v_3(n)=A \sin(\omega nT)$$

by applying a simple trigonometric identity, the square of the signal $v_3(n)$ is:

$$y(n)=v_3^2(n)=A^2[\sin(\omega nT)]^2=0.5\, A^2-0.5\, A^2 \cos(2\omega nT)]$$

Therefore, the squared signal, $y(n)$, consists of two components; a zero-frequency signal information about the amplitude of the signal, $0.5\, A^2$; plus a single (unknown)-frequency sinusoid, $-0.5\, A^2\cos(2\omega nT)$.

The reference signal $V_{REF}$ sets the amplitude of the signal $v_3$. If the desired signal amplitude is D, and the value $V_{REF}$ is a constant, then $V_{REF}$ should have a value of $0.5\, D^2$. A subtractor 327 subtracts the square from the multiplier 326 from $V_{REF}$, so that the different signal $x_n$ has a DC value of $0.5(D^2-A^2)$, plus the double frequency term containing $2\omega$. The zero-frequency error signal $0.5(D^2-A^2)$ is produced even though none of the sample values of the signal $v_3$ may have a value equal to the amplitude A.

In order to remove the double frequency term, the automatic gain control 146 includes a notch filter generally designated 328. This notch filter includes a first delay unit 329 producing a signal $x_{n-1}$, and a second delay unit 330 producing a signal $x_{n-2}$. The notch filter further includes a multiplier 331 for multiplying the signal $x_{n-1}$ by a tuning parameter $\beta_5$, and an adder/subtractor 332 which adds the signal $x_n$ to the signal $x_{n-2}$ and subtracts the product from the multiplier 331 to produce an amplitude error signal $v_{14}$ from which the double frequency term is substantially removed. The signal $v_{14}$ is scaled by an adjustable scale factor $\mu_3$ to produce a scaled error signal that is accumulated by the accumulator 322.

The tuning parameter $\beta_5$ sets the notch frequency for the notch filter 328. $\beta_5$ could be obtained by doubling $\beta_1$ of the tracking filter. Alternatively, as further shown in FIG. 23, a feedback loop automatically adjusts the tuning parameter $\beta_5$ in order to minimize the presence of the double frequency term in the signal $v_{14}$. In particular, this feedback loop includes a high-pass filter generally designated 333 for removing the DC component of the signal $v_{14}$ to produce an error signal $\epsilon$. The high-pass filter includes a delay unit 334 and a subtractor 335 which computes the difference between the signal $v_{14}$ and the output of the delay unit 334.

In order to determine a signal for adjusting $\beta_5$ to minimize the double frequency component in the error signal $\epsilon$, consider that the frequency response $F_1(z)$ of a notch filter 328 is:

$$F_1(z)=1-\beta_5 z^{-1}+z^{-2}$$

and the frequency response of $F_2(z)$ of the high-pass filter 333 is:

$$F_2(z)=1-z^{-1}$$

Therefore, the combined transfer function of the notch filter and the high-pass filter is:

$$F_1(z)F_2(z)=1-(1+\beta_5)z^{-1}+(1+\beta_5)z^{-2}-z^{-3}$$

and the error signal $\epsilon$ as given by:

$$\epsilon=x_n-(1+\beta_5)x_{n-1}+(1+\beta_5)x_{n-2}-x_{n-3}$$

The rate of change of the error signal $\epsilon$ with respect to the tuning parameter $\beta_5$ is:

$$\partial\epsilon/\partial\beta_5=-x_{n-1}+x_{n-2}$$

What is desired is to determine the rate of change of the tuning signal $\beta_5$ with respect to time $(\dot{\beta}_5)$ in order to minimize a performance index $J=\epsilon^2$ by making the rate of change of $\beta_5$ proportional to the error, i.e., $\dot{\beta}_5=-\partial J/\partial\beta_5 \mu_4$ where $\mu_4$ is a convergence parameter. First note that the rate of change of J with respect to $\beta_5$ is given by:

$$\partial J/\partial\beta_5=(\partial J/\partial\epsilon)(\partial\epsilon/\partial\beta_5)$$

and the rate of change of J with respect to $\epsilon$ is given by:

$$\partial J/\partial\epsilon=2\,\epsilon$$

Therefore, the desired solution is:

$$\dot{\beta}_5=\Delta\beta_5/T=-\mu_4(\partial J/\partial\beta_5)=-\mu_4(\partial J/\partial\epsilon)(\partial\epsilon/\partial\beta_5)$$

$$\dot{\beta}_5=-2\mu_4\epsilon(-x_{n-1}+x_{n-2})$$

In order to compute the desired control parameter $\dot{\beta}_5$, a subtractor 336 subtracts $x_{n-2}$ from $x_{n-1}$ to produce a signal indicating the rate of change of $\epsilon$ with respect to $\beta_5$. A multiplier 337 multiplies this difference from the subtractor 336 with $\epsilon$ from the subtractor 335 and further multiplies this product by a preselected coefficient $2\mu_4$ to produce the desired control parameter $\dot{\beta}_5$. In effect, the multiplier 337 multiplies the derivative $(x_{n-1}-x_{n-2})$ of the notch filter input signal x by the derivative of the notch filter output signal $v_{14}$ to produce the tuning control parameter $\dot{\beta}_5$. The control parameter $\dot{\beta}_5$ is accumulated in an accumulator generally designated 338 including an adder 339, a limiter 340, and a delay unit or accumulator register 341. The delay unit 341 provides the tuning parameter $\beta_5$. The accumulator 338 functions as an integrator and lowpass filter.

Figure 24:
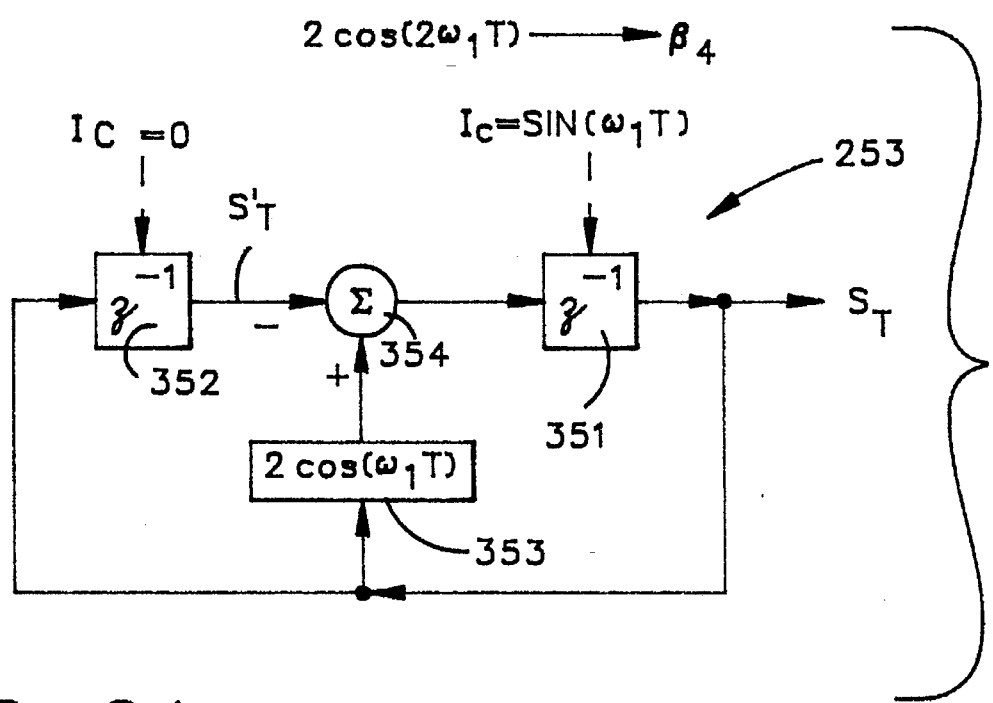
FIG. 24 is a schematic diagram of a test oscillator introduced in FIG. 15A.

Turning now to FIG. 24, there is shown a schematic diagram of the test oscillator 253. The test signal $S_T$ is the output of a delay unit or register 351 providing a delay of one sampling period T. The test signal $S_T$ is fed back to another delay unit or register 352 also providing a delay of one sampling period T, and scaled in a scaling unit 353 having a gain set to $2\cos\omega_1 T$. This gain of the scaling unit 353 determines the frequency $\omega_1$ of the test signal $S_T$. A subtractor 354 subtracts the output of the scaling unit 353 from the output $S'_T$ of the delay unit 352 to produce a sum that is received by the delay unit 351. Initially, the delay unit 352 is set to a value of zero, and the delay unit 351 is set to a value of $\sin\omega_1 T$. The tuning parameter $\beta_4$ is equal to $2\cos(2\omega_1 T)$. These initial conditions (IC), for example, are preset values that are initially loaded into the registers or memory locations of the delay units 351, 352 when the inertial measurement unit 50 of FIG. 1 is first turned on.

Figure 25:
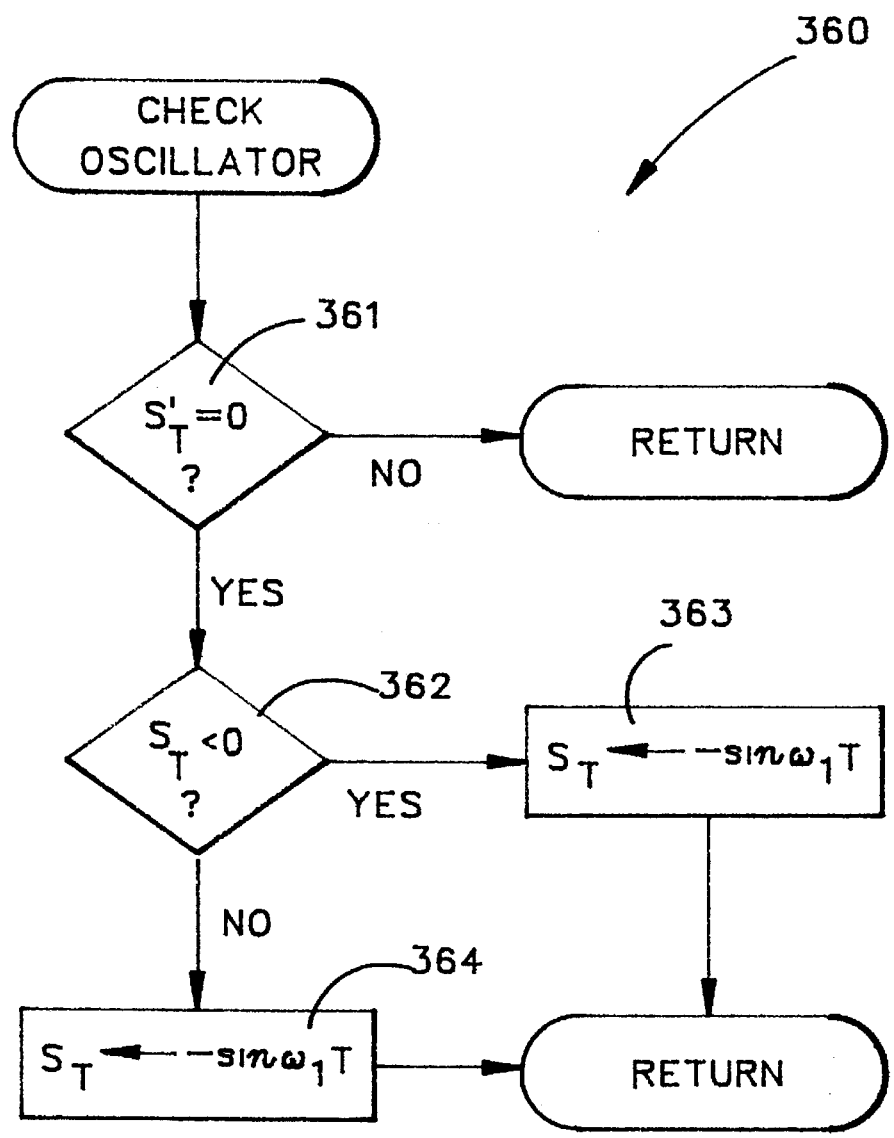
FIG. 25 is a flowchart of a method for selectively resetting the test oscillator of FIG. 24 to prevent amplitude drift due to accumulation of round-off error.

Turning now to FIG. 25, there is shown a flowchart 360 of a procedure for selectively resetting the test oscillator (253 in FIG. 24) from time-to-time to prevent amplitude drift in the test signal $S_T$ due to accumulation of roundoff error. The procedure of FIG. 25, for example, is performed once during each sampling time. When the synchronous logic of FIG. 14 is implemented as a programmed digital signal processor, for example, the procedure of FIG. 25 is specified by a routine performed when the processor is interrupted at the sampling frequency $f_s$.

In the first step 361, the value of the output $S'_T$ of the delay unit 352 is compared to zero. If it is not zero, then no resetting of the oscillator is performed for the sampling time. Otherwise, if the value of $S'_T$ is equal to zero, then in step 362, the value of the test signal $S_T$ from the delay unit 351 is compared to zero. If the value of the test signal $S_T$ from the delay unit 351 is less than zero, then in step 363 the delay unit 351 in FIG. 24 is reset in order to set the value of the test signal $S_T$ to a value of $-\sin\omega_1 T$. Otherwise, in step 364, when the value of the test signal $S_T$ is greater than zero, the delay unit 351 in FIG. 24 is reset in order to set the value of the test signal $S_T$ to a value of $\sin\omega_1 T$.

In view of the above, there has been described a method and apparatus for detecting the amplitude of a sparsely sampled sinusoidal signal. By squaring the sample values and automatically tuning a notch filter to remove the double-frequency component, the amplitude information is recovered, even though none of the samples may have a value equal to the amplitude of the signal. The notch filter and the tuning control circuit are easily implemented using digital filter techniques. The circuits are robust, and require a minimum of computational components.

APPENDIX I

MATHCAD (Trademark) PROGRAM
TRACKING FILTER DESIGN
QRSTRACK
*****************************************************

INPUTS $f_s := 2^{15}$    $f_s = 3.277 \cdot 10^4$            The sampling frequency in Hz.

$f_h := 500$            The 3-dB-passband width of the filter in Hz.

$f_o := 10000$            Tuning frequency of the filter. The actual adjustment is via parameter $\beta$.

$N := 1$            Number of cascaded stages of filtering.

*****************************************************

SETUP $T := f_s^{-1}$            Sampling period: $T = 3.052 \cdot 10^{-5}$ $\alpha := \dfrac{1 - \tan[0.5 \cdot \pi \cdot f_h \cdot T]}{1 + \tan[[0.5 \cdot \pi \cdot f_h \cdot T]]}$            The passband-width parameter: $\alpha = 0.953$ $\beta := -\cos[2 \cdot \pi \cdot f_o \cdot T]$            The tuning parameter: $\beta = 0.34$ $K := 100$    $k := 0 \,.. K - 1$            The number of frequency-analysis points used in performance evaluation and the frequency-analysis index.

$$f_k := \frac{f_s}{2} \cdot \frac{k+1}{K}$$

The analysis frequencies.

$$z := \overline{\exp(2j \cdot \pi \cdot f \cdot T)}$$

The discrete-time variable in steady state.

$$G := \overline{\left[\frac{z^{-2} + \beta \cdot (1+\alpha) \cdot z^{-1} + \alpha}{1 + \beta \cdot (1+\alpha) \cdot z^{-1} + \alpha \cdot z^{-2}}\right]}$$

The simplest second-order all-pass filter realizable by a Gray-Markel lattice structure.

$$H := \overline{\left[\left[\frac{1}{2} \cdot (1 - G)\right]^N\right]}$$

A simple 2nd-order bandpass filter with unity passband gain, single-parameter tuning, single-parameter passband-width adjustment, and minimum coefficient sensitivity.

$$HdB := 20 \cdot \overline{\log(H)}$$

Filter amplitude-frequency response expressed in dB.

$$R := \overline{\left[\frac{Im(H)}{Re(H)}\right]}$$

The Q/I ratio of Hilbert-transform outputs.

APPENDIX II.

MATHCAD (Trademark) PROGRAM
OPTIMUM HILBERT TRANSFORMER DESIGN PROGRAM
QRSHILBERT.MCD

**\*\*\*\*\*\*\*\*\*\*\*\*\*\*\*\*\*\*\*\*\*\*\*\*\*\*\*\*\*\*\*\*\*\*\*\*\*\*\*\*\*\*\*\*\*\*\*\*\*\*\*\*\*\*\*\*\*\***

INITIALIZE $f_s := 2^{15}$  Sampling frequency $f_{min} := 8000$  Minimum Hilbert transformer passband edge $f_{max} := 12000$  Maximum Hilbert transformer passband edge $f_0 := f_{max} - \frac{f_s}{4} \quad f_1 := \frac{f_s}{4} - f_{min}$  Frequency vector components $R := \frac{f_s}{max(f)} \quad R = 8.605$  Ratio of sampling frequency to passband-edge frequency of the baseband filter $B := 30$  Number of bits to use in coefficient values $A_{pb} := -90$  Passband peak ripple spec in dB $N := floor\left[R \cdot \frac{A_{pb} + 13}{29.2 \cdot (4 - R)} + \frac{1}{4}\right]$  Calculation of number of multiplier coefficients required to meet the ripple spec.

$m := 0 \ .. \ N \quad\quad ZERO_m := 0 \quad\quad N = 5$

WRITEPRN(FB) := ZERO □  PRINTCOLWIDTH := 10

WRITEPRN(FA) := ZERO □  PRNPRECISION := 10

WRITE(COUNT) := 0 ☐ Type "PROCESS", comment FA, FB, & COUNT, then GOTO 165.
*****************************************************************

5                               SETUP

| | | |
|---|---|---|
| ITERATION := READ(COUNT) | ITERATION = 3 | PBE := $(R)^{-1}$ |
| WRITE(COUNT) := 1 + ITERATION | | PBE = passband edge |
| ITERATION := READ(COUNT) | ITERATION = 4 | PBE = 0.1162109375 |

10   n := 0 ..N q := 0 ..N - 1 n and r are indices. "N" is reserved for computing the filter performance error or ripple; index values 0 through N-1 are for the actual multiplier-coefficient indices. The multiplier-coefficient index is q.

FA := READPRN(FA)

Measured passband extremal frequencies

15   FB := READPRN(FB)

Measured stopband extremal frequencies $$FPB_m := if\left[ITERATION \approx 1, PBE \cdot \frac{m}{N}, FA_m\right]$$

Passband extremal frequencies used in calculations $$FSB_m := if\left[ITERATION \approx 1, \frac{1}{2} - \left[1 - \frac{m}{N}\right] \cdot PBE, FB_m\right]$$

20                                                                  Stopband extremal frequencies used in calculations.

$$M_{m,n} := if\left[n \approx N, 2 \cdot (-1)^m, 4 \cdot \cos[(2 \cdot n + 1) \cdot 2 \cdot \pi \cdot FPB_m]\right]$$

Remez matrix $r_m := 1$  The all-unit vector.

$\alpha := M^{-1} \cdot r$  The coefficient and error vector.

5  $\delta := \alpha_N$  The error measure $a_q := 2^{-B} \cdot \left[floor\left[.5 + 2^{B+1} \cdot \alpha_q\right]\right]$  Filter coefficients doubled and rounded to B bits.

$K := 256$  Number of points for frequency analysis.

$k := 0 \,..K - 1$  Frequency-response evaluation index.

$FFPB_k := PBE \cdot \dfrac{k}{K - 1}$  Frequency variable for passband-performance evaluation.

$FFSB := \dfrac{1}{2} - FFPB$  Frequency variables for stopband-performance evaluation.

10

$FG := \dfrac{1}{2} \cdot \dfrac{FFPB}{PBE}$  Frequency variable for total filter evaluation.

\*\*\*\*\*\*\*\*\*\*\*\*\*\*\*\*\*\*\*\*\*\*\*\*\*\*\*\*\*\*\*\*\*\*\*\*\*\*\*\*\*\*\*\*\*\*\*\*\*\*\*\*\*\*\*\*\*\*\*\*\*\*\*\*

15  PASSBAND PERFORMANCE EVALUATION

The exact expression for the passband error is:

$$EPB := 1 - \frac{1}{2} \cdot \left[ 1 + \sum_q 2 \cdot a_q \cdot \cos((2 \cdot q + 1) \cdot 2 \cdot \pi \cdot FFPB) \right]$$

$EPB_K := EPB_{K-1}$  Define an artificial end point to make the notation work.

$XPB_{k+1} := if\ [EPB_{k+1} < EPB_k, \delta, -\delta]$  Filter performance and passband extremal-frequency marker.

Now we can estimate the passband extremal frequencies:

$PB_{k+1} := if\ [XPB_{k+1} \approx -XPB_k, FFPB_k, PBE]$ $SPB_m := (sort(PB))_m$  Extract N + 1 passband extremal-frequency estimates.

$WRITEPRN(FA) := SPB$  This puts the estimated passband extremal frequencies into memory.

$PBRIPPLE := 20 \cdot \log\ [\max[(|EPB|)]]$  Computation of the peak passband ripple dB.

\*\*\*\*\*\*\*\*\*\*\*\*\*\*\*\*\*\*\*\*\*\*\*\*\*\*\*\*\*\*\*\*\*\*\*\*\*\*\*\*\*\*\*\*\*\*\*\*\*\*\*\*\*\*\*\*\*\*\*\*\*\*\*\*\*

STOPBAND PERFORMANCE EVALUATION

The exact expression for the stopband error is:

$$ESB := 0 - \frac{1}{2} \cdot \left[ 1 + \sum_q 2 \cdot a_q \cdot \cos((2 \cdot q + 1) \cdot 2 \cdot \pi \cdot FFSB) \right]$$

$ESB_K := ESB_{K-1}$  Define an artificial end point to make the notation work.

$$XSB_{k+1} := if\left[ESB_{k+1} < ESB_k, -\delta, \delta\right]$$

Filter performance and stopband extremal-frequency marker.

Now we can estimate the stopband extremal frequencies:

$$SB_{k+1} := if\left[XSB_{k+1} \approx -XSB_k, FFSB_k, \frac{1}{2} - PBE\right] \qquad SB_K := \frac{1}{2}$$

SORTSB$_m$ := (-sort(-SB))$_m$

SSB := sort(SORTSB)

WRITEPRN(FB) := SSB

Extract N + 1 stopband extremal-frequency estimates and sort them in ascending order.

This puts the estimated stopband extremal frequencies into memory.

$$SBRIPPLE := 20 \cdot \log\left[\max\left[\overline{(|ESB|)}\right]\right]$$

Compute the peak stopband ripple in dB.

\*\*\*\*\*\*\*\*\*\*\*\*\*\*\*\*\*\*\*\*\*\*\*\*\*\*\*\*\*\*\*\*\*\*\*\*\*\*\*\*\*\*\*\*\*\*\*\*\*\*\*\*\*\*\*\*\*\*\*\*\*\*\*\*\*

PROTOTYPE FILTER PERFORMANCE SUMMARY

The cascaded half-band prototype filter overall frequency response is given by:

$$GPB := \frac{1}{2} \cdot \left[1 + \sum_q 2 \cdot a_q \cdot \cos\left((2 \cdot q + 1) \cdot 2 \cdot \pi \cdot FG\right)\right]$$

Filter coefficient values:

$$a = \begin{bmatrix} 0.6142410357 \\ -0.1529612327 \\ 0.0496214228 \\ 0.0127215311 \\ 0.0018368168 \end{bmatrix}$$

ITERATION = 4             N = 5
PBRIPPLE = -95.6          B = 30
SBRIPPLE = -95.6          R = 8.6050420168
SPECS: $A_{pb}$ = -90      $\delta$ = -0.000016511

\*\*\*\*\*\*\*\*\*\*\*\*\*\*\*\*\*\*\*\*\*\*\*\*\*\*\*\*\*\*\*\*\*\*\*\*\*\*\*\*\*\*\*\*\*\*\*\*\*\*\*\*\*\*\*\*\*\*\*\*\*\*\*\*\*

CONVERT THE PROTOTYPE DESIGN TO A HILBERT TRANSFORMER $FH_k := \dfrac{k}{K}$     The evaluation frequencies $j := \sqrt{-1}$     Discrete-time variable in steady state $z := \overline{\exp(j \cdot 2 \cdot \pi \cdot FH)}$ $p := 0.44 \cdot N - 2$     Hilbert-transformer-coefficient index $i_p := p - (2 \cdot N - 1)$     A useful auxiliary vector The Hilbert transformer coefficient values:

$b_p := if\left[p = 2 \cdot N - 1, 1, if\left[\mod(p,2) = 1, 0, a_{\left[\frac{|i_p|-1}{2}\right]}\right] \cdot \exp\left[j \cdot i_p \cdot \dfrac{\pi}{2}\right]\right]$ $G := \overline{\left[z^{2 \cdot N-1} \cdot \displaystyle\sum_{p} b_p \cdot z^{-p}\right]}$     The transfer function of the Hilbert transformer \*\*\*\*\*\*\*\*\*\*\*\*\*\*\*\*\*\*\*\*\*\*\*\*\*\*\*\*\*\*\*\*\*\*\*\*\*\*\*\*\*\*\*\*\*\*\*\*\*\*\*\*\*\*\*\*\*\*\*\*\*\*\*\*

EVALUATE THE PERFORMANCE OF THE HILBERT TRANSFORMER $$GR := \left[ z^{2 \cdot N - 1} \cdot \sum_q Re[b_p] \cdot z^{-p} \right]$$

The real part of the Hilbert transformer $$GI := \left[ z^{2 \cdot N - 1} \cdot \sum_p Im[b_p] \cdot z^{-p} \right]$$

The imaginary part of the Hilbert transformer $$b = \begin{bmatrix} -0.0018368168j \\ 0 \\ -0.0127215311j \\ 0 \\ -0.0496214228j \\ 0 \\ 0.1529612327j \\ 0 \\ 0.6142410357j \\ 1 \\ 0.6142410357j \\ 0 \\ 0.1529612327j \\ 0 \\ 0.0496214228j \\ 0 \\ 0.0127215311j \\ 0 \\ 0.0018368168j \end{bmatrix}$$

END OF PROGRAM

I claim:

1. A method comprising the steps of:
   a) providing an analog signal from a resonator, said analog signal including a sinusoidal component;
   b) digitizing said analog signal to produce a digital input signal (x);
   c) scaling said digital input signal (x) in an AGC amplifier by an AGC-control signal (w) to produce an amplitude-controlled input signal, (y)=(w)(x);
   d) subtracting from a reference constant, REF, the square of said amplitude-controlled signal, (y), to produce a raw error signal, (u)=REF−(y)$^2$;
   e) passing said raw error signal (u) through an adjustable notch filter automatically controlled by a frequency control signal ($\beta$) setting a signal rejection frequency of said notch filter, thereby producing a filtered error signal (v) from said notch filter;
   f) producing said frequency control signal ($\beta$) as a predetermined function of said raw error signal (u) and said filtered error signal (v) by producing a product of a derivative of said raw error signal (u) and a derivative of said output signal (v), and low-pass filtering said product to produce said frequency control signal ($\beta$);
   g) adjusting said notch filter with said frequency control signal ($\beta$) to substantially remove said sinusoidal component from said filtered error signal (v); and
   h) providing the filtered error signal (v) from said notch filter to an additional device for further use.

2. The method as claimed in claim 1, wherein said low-pass filtering said product is performed by integrating said product.

3. The method as claimed in claim 1, wherein said derivative of said input signal is computed as differences between samples of said input signal, and said derivative of said output signal is computed as differences between samples of said output signal.

4. The method as claimed in claim 3, wherein said output signal (v) is computed from successive samples ($x_n$, $x_{n-1}$, $x_{n-2}$) of said input signal and said frequency control signal ($\beta$) substantially according to:

$$v_n = x_n - \beta x_{n-1} + x_{n-2}.$$

5. The method as claimed in claim 4, wherein said product is proportional to $(v_n - v_{n-1})(x_{n-1} - x_{n-2})$.

6. A method comprising the steps of:
   a) providing an analog signal from a resonator, said analog signal including a sinusoidal component having a frequency ($\omega$);
   b) digitizing and gain-scaling said analog sinusoidal signal to produce an amplitude-controlled input signal (y);
   c) subtracting from a reference REF the square of said amplitude-controlled input signal (y) to produce a raw error signal (u)=REF−y$^2$ including a low-frequency component responsive to said amplitude and a double-frequency component at twice the frequency ($\omega$) of said sinusoidal signal;
   d) passing said raw error signal (u) through an adjustable notch filter to produce a filtered error signal (v) including said low-frequency component responsive to said amplitude, said adjustable notch filter having a frequency control input responsive to a frequency control signal ($\beta$) for adjusting a notch frequency at which said adjustable notch filter rejects signals;
   e) automatically adjusting said frequency control signal ($\beta$) so that said double-frequency component is substantially rejected by said adjustable notch filter and removed from said filtered error signal (v);
   f) integrating said filtered error signal (v) to produce an AGC-control signal (w); and
   g) multiplying said digital input signal (x) by said AGC-control signal (w) to produce said amplitude-controlled input signal (y)=(w)(x).

7. The method as claimed in claim 6, wherein said frequency control signal ($\beta$) is adjusted automatically in response to said product signal and said filtered signal.

8. A method comprising the steps of:
   a) extracting an analog sinusoidal signal, said analog sinusoidal signal having a frequency ($\omega$), from a resonator;
   b) digitizing and gain-scaling said analog sinusoidal signal to produce an amplitude-controlled input signal (y);
   c) subtracting from a reference REF the square of said amplitude-controlled input signal (y) to produce a raw error signal (u)=REF−y$^2$ including a low-frequency component responsive to said amplitude and a double-frequency component at twice the frequency ($\omega$) of said sinusoidal signal;
   d) passing said raw error signal (u) through an adjustable notch filter to produce a filtered error signal (v) including said low-frequency component responsive to said amplitude, said adjustable notch filter having a frequency control input responsive to a frequency control signal ($\beta$) for adjusting a notch frequency at which said adjustable notch filter rejects signals;
   e) automatically adjusting said frequency control signal ($\beta$), in response to said raw error signal (u) and said filtered error signal (v), so that said double-frequency component is substantially rejected by said adjustable notch filter and removed from said filtered error signal (v), said frequency control signal ($\beta$) being adjusted automatically in response to a product of a derivative of said raw error signal (u) and a derivative of said filtered error signal (v);
   f) integrating said filtered error signal (v) to produce an AGC-control signal (w); and
   g) multiplying said digital signal (x) by said AGC-control signal (w) to produce said amplitude-controlled input signal (y)=(w)(x).

9. The method as claimed in claim 8, wherein said derivative of said input signal is computed as differences between samples of said input signal, and said derivative of said output signal is computed as differences between samples of said output signal.

10. The method as claimed in claim 9, wherein said output signal (v) is computed from successive samples ($x_n$, $x_{n-1}$, $x_{n-2}$) of said input signal and said frequency control signal ($\beta$) substantially according to:

$$v_n = x_n - \beta x_{n-1} + x_{n-2}.$$

11. The method as claimed in claim 10, wherein said product is proportional to $(v_n - v_{n-1})(x_{n-1} - x_{n-2})$.

12. A self-adjusting system for filtering an analog signal (x) from a resonator to substantially remove a sinusoidal component of said analog signal to produce a filtered output signal (v) on a signal output, said system comprising:
   a) an extractor connected for extracting said analog signal from said resonator;
   b) an analog-to-digital converter connected for digitizing said analog signal to produce an input signal at a signal input;

c) an adjustable notch filter having said signal input, said signal output, and a frequency control input responsive to a frequency control signal (β) for adjusting a notch frequency at which said adjustable notch filter rejects signals; and d) a frequency control circuit connected to said adjustable notch filter for generating said frequency control signal (β) in response to a product of a derivative of said input signal (x) and a derivative of said output signal (v).

13. The self-adjusting system as claimed in claim 12, wherein said frequency control circuit includes an integrator for integrating said product to produce said frequency control signal.

14. The self-adjusting system as claimed in claim 12, wherein said notch filter is a digital filter for computing said output signal (v) from successive samples $(x_n, x_{n-1}, x_{n-2})$ of said input signal (x) substantially according to:

$$V_n = x_n - \beta x_{n-1} + x_{n-2}.$$

15. The self-adjusting system as claimed in claim 14, wherein said frequency control circuit includes a multiplier for computing said product substantially proportional to:

$$(x_{n-1} - x_{n-2})(v_n - v_{n-1}).$$

16. The self-adjusting system as claimed in claim 15, wherein said frequency control circuit includes an accumulator connected to said multiplier for accumulating values of said product to produce said frequency control signal.

17. An amplitude detector circuit for detecting amplitude of a sinusoidal signal having a frequency (ω), said amplitude detector circuit comprising:

a multiplier for squaring said sinusoidal signal to produce a product signal including a low-frequency component responsive to said amplitude and a double-frequency component at twice the frequency (ω) of said sinusoidal signal;

an automatically adjustable notch filter connected to said multiplier for filtering an input signal (x) responsive to said product signal to produce a filtered signal (v) indicating said amplitude, said adjustable notch filter having a frequency control input for receiving a frequency control signal (β) for adjusting a notch frequency at which said adjustable notch filter rejects signals; and a frequency control circuit connected to said adjustable notch filter for producing said frequency control signal (β) and automatically adjusting said frequency control signal in response to said input signal (x) and said filtered signal (v) so that said double-frequency component is substantially rejected by said adjustable notch filter and removed from said filtered signal (v).

18. An amplitude controller circuit for controlling the amplitude of a sinusoidal signal having a frequency (ω), said amplitude controller circuit comprising:

a) a multiplier for squaring said sinusoidal signal to produce a product signal including a low-frequency component responsive to said amplitude and a double-frequency component at twice the frequency (ω) of said sinusoidal signal;

b) a subtractor to produce a raw error signal (u) by subtracting from a reference value REF said product signal;

c) an adjustable notch filter connected to said subtractor for filtering said raw error signal (u) to produce a filtered error signal (v) indicating the error in said amplitude, said adjustable notch filter having a frequency control input for receiving a frequency control signal (β) for adjusting a notch frequency at which said adjustable notch filter rejects signals; and d) a frequency control circuit connected to said adjustable notch filter for producing said frequency control signal (β) and automatically adjusting said frequency control signal in response to said raw error signal (u) and said filtered error signal (v) so that said double-frequency component is substantially rejected by said adjustable notch filter and removed from said filtered error signal (v), said frequency control circuit including a computational circuit for computing a product of a derivative of said raw error signal (u) and a derivative of said filtered error signal (v), and an integrator for integrating said product of said derivative of said raw error signal (u) and said derivative of said filtered error signal (v), to produce said frequency control signal (β).

19. The amplitude detector circuit as claimed in claim 18, wherein said notch filter is a digital filter for computing said output signal (v) from successive samples $(x_n, x_{n-1}, x_{n-2})$ of said input signal (x) substantially according to:

$$v_n = x_n - \beta x_{n-1} + x_{n-2}$$

and said computational circuit computes said product of said derivative of said input signal (x) and said derivative of said filtered signal (v) substantially proportional to:

$$(x_{n-1} - x_{n-2})(v_n - x_{n-1}).$$

20. An automatic gain control circuit for adjusting amplitude of a sinusoidal signal having a frequency (ω), said automatic gain control circuit comprising:

a multiplier for squaring said sinusoidal signal to produce a product signal including a low-frequency component responsive to said amplitude and a double-frequency component at twice the frequency (ω) of said sinusoidal signal;

an adjustable notch filter connected to said multiplier for filtering an input signal (x) responsive to said product signal to produce a filtered signal (v) indicating said amplitude, said automatically adjustable notch filter being adjusted to reject said double-frequency component at twice the frequency (ω) of said sinusoidal signal; and a multiplier connected to said adjustable notch filter for adjusting said amplitude of said sinusoidal signal in response to said filtered signal (v).

21. An automatic gain control circuit for adjusting amplitude of a sinusoidal signal having a frequency (ω), said automatic gain control circuit comprising:

a) a multiplier for squaring said sinusoidal signal to produce a product signal including a low-frequency component responsive to said amplitude and a double-frequency component at twice the frequency (ω) of said sinusoidal signal;

b) a subtractor to produce a raw error signal (u) by subtracting from a reference value REF said product signal;

c) an adjustable notch filter connected to said subtractor for filtering said raw error signal (u) to produce a filtered error signal (v) indicating the error in said amplitude, said adjustable notch filter being automatically adjusted to reject said double-frequency component at twice the frequency (ω) of said sinusoidal signal;

d) a multiplier connected to said adjustable notch filter for adjusting said amplitude of said sinusoidal signal in response to said filtered error signal (v); and e) an integrator connected between said adjustable notch filter and said multiplier for integrating said filtered error signal (v) to produce an integrated signal for controlling a scale factor of said multiplier.

22. An automatic gain control circuit for adjusting amplitude of a sinusoidal signal having a frequency ($\omega$), said automatic gain control circuit comprising:

a) a multiplier for squaring said sinusoidal signal to produce a product signal including a low-frequency component responsive to said amplitude and a double-frequency component at twice the frequency ($\omega$) of said sinusoidal signal;

b) a subtractor to produce a raw error signal (u) by subtracting from a reference value REF said product signal;

c) an adjustable notch filter connected to said subtractor for filtering said raw error signal (u) to produce a filtered error signal (v) indicating the error in said amplitude, said adjustable notch filter being automatically adjusted to reject said double-frequency component at twice the frequency ($\omega$) of said sinusoidal signal, said notch filter being a digital filter for computing said filtered error signal (v) from successive samples $u_n$, $u_{n-1}$, $u_{n-2}$ of said raw error signal (u) substantially according to:

$$v_n = u_n - \beta u_{n-1} + u_{n-2}$$

and said notch filter being responsive to a frequency control signal ($\beta$) adjusted to reject said double-frequency component at twice the frequency ($\omega$) of said sinusoidal signal;

d) a multiplier connected to said adjustable notch filter for adjusting said amplitude of said sinusoidal signal in response to said filtered error signal (v); and e) an integrator connected between said adjustable notch filter and said multiplier for integrating said filtered error signal (v) to produce an integrated signal for controlling a scale factor of said multiplier.

23. The automatic gain control circuit as claimed in claim 22, further comprising a frequency control circuit connected to said notch filter for automatically adjusting said frequency control signal by computing a predetermined function of said input signal (x) and said output signal (v) so that said double-frequency component is substantially rejected by said adjustable notch filter and removed from said filtered signal (v).

24. The automatic gain control circuit as claimed in claim 23, wherein said frequency control circuit includes a computational circuit for computing a product of a derivative of said input signal (x) and a derivative of said filtered signal (v), and an integrator for integrating said product of said derivative of said input signal (x) and said derivative of said filtered signal (v), to produce said frequency control signal ($\beta$).

25. The automatic gain control circuit as claimed in claim 24, wherein said computational circuit computes said product of said derivative of said input signal (x) and said derivative of said filtered signal (v) substantially proportional to:

$$(x_{n-1} - x_{n-2})(v_n - v_{n-1}).$$

* * * * *